United States Patent
Kim et al.

(10) Patent No.: US 12,324,314 B2
(45) Date of Patent: Jun. 3, 2025

(54) DISPLAY DEVICE AND METHOD OF FABRICATING THE SAME

(71) Applicant: Samsung Display Co., Ltd., Yongin-Si (KR)

(72) Inventors: Yool Guk Kim, Hwaseong-si (KR); Ji Yoon Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 477 days.

(21) Appl. No.: 17/469,926

(22) Filed: Sep. 9, 2021

(65) Prior Publication Data

US 2022/0165817 A1     May 26, 2022

(30) Foreign Application Priority Data

Nov. 24, 2020   (KR) ......... 10-2020-0159037

(51) Int. Cl.
| | |
|---|---|
| H10K 59/122 | (2023.01) |
| H10K 50/854 | (2023.01) |
| H10K 50/86 | (2023.01) |
| H10K 59/131 | (2023.01) |
| H10K 59/38 | (2023.01) |
| H10K 71/00 | (2023.01) |
| H10K 59/12 | (2023.01) |

(52) U.S. Cl.
CPC ......... *H10K 59/122* (2023.02); *H10K 50/854* (2023.02); *H10K 50/865* (2023.02); *H10K 59/131* (2023.02); *H10K 59/38* (2023.02); *H10K 71/00* (2023.02); *H10K 59/1201* (2023.02)

(58) Field of Classification Search
None
See application file for complete search history.

(56) References Cited

U.S. PATENT DOCUMENTS

| | | |
|---|---|---|
| 9,799,712 B2 | 10/2017 | Kishimoto et al. |
| 10,840,313 B2 | 11/2020 | Jang et al. |
| 11,024,696 B2 | 6/2021 | Cha et al. |
| 11,411,055 B2 | 8/2022 | Jang et al. |
| 11,974,487 B2 | 4/2024 | Jang et al. |

(Continued)

FOREIGN PATENT DOCUMENTS

| | | |
|---|---|---|
| KR | 10-0786294 B1 | 12/2007 |
| KR | 10-2016-0083487 A | 7/2016 |

(Continued)

*Primary Examiner* — Michelle Mandala
(74) *Attorney, Agent, or Firm* — Innovation Counsel LLP

(57) ABSTRACT

A display device includes a substrate comprising a display area and a non-display area, a via layer disposed on the substrate, a pixel electrode disposed on the via layer in the display area, and a pixel-defining layer disposed on the pixel electrode and a part of the via layer exposed by the pixel electrode, wherein the pixel-defining layer comprises a first area disposed in the display area and comprising an opening exposing a part of the pixel electrode, and a second area disposed in the non-display area and comprising an end, and wherein the first area comprises a first side surface defining the opening, wherein the second area comprises a second side surface at the end, wherein a first taper angle which is a taper angle of the first side surface is different from a second taper angle which is a taper angle of the second side surface.

18 Claims, 13 Drawing Sheets

120: GE
130: SD1, SD2, VSS
140: PXE, CP
EL: PXE, EML, CME
TR: ACT, GE, SD1, SD2

(56) References Cited

U.S. PATENT DOCUMENTS

| | | | | |
|---|---|---|---|---|
| 2017/0301889 A1* | 10/2017 | Hayashida | ........... | H10K 71/135 |
| 2018/0013096 A1* | 1/2018 | Hamada | ................. | H10K 59/40 |
| 2018/0122882 A1* | 5/2018 | Lee | ..................... | H10K 59/131 |
| 2019/0058020 A1* | 2/2019 | Tsai | ..................... | H10K 59/131 |
| 2019/0081280 A1* | 3/2019 | Horikawa | ............ | H10K 50/841 |
| 2021/0020733 A1* | 1/2021 | Saida | ..................... | H05B 33/06 |
| 2024/0284750 A1 | 8/2024 | Jang et al. | | |

FOREIGN PATENT DOCUMENTS

| | | |
|---|---|---|
| KR | 10-2017-0045459 A | 4/2017 |
| KR | 10-2017-0086152 A | 7/2017 |
| KR | 10-2020-0029681 A | 3/2020 |
| KR | 10-2020-0063377 A | 6/2020 |
| KR | 10-2020-0066498 A | 6/2020 |

\* cited by examiner

DISPLAY DEVICE AND METHOD OF FABRICATING THE SAME

CROSS-REFERENCE TO RELATED APPLICATION(S)

This application claims priority from Korean Patent Application No. 10-2020-0159037, filed on Nov. 24, 2020, in the Korean Intellectual Property Office, the disclosure of which is incorporated herein by reference in its entirety.

BACKGROUND

1. Field of the Disclosure

The present disclosure generally relates to a display device, and a method of fabricating the same. More particularly, the present disclosure relates to a display device capable of reducing deviations in the thickness of emissive layers and preventing a common electrode from being disconnected and a method of the fabricating the same.

2. Description of the Related Art

Display devices become more and more important as multimedia technology evolves. Accordingly, a variety of types of display devices such as liquid-crystal display (LCD) devices and organic light-emitting display (OLED) devices are currently used.

The inkjet printing technique (or solution-based printing technique) allows for large area patterning without complicated processes such as vacuum and etching, and is advantageous for achieving high resolution. For example, the inkjet printing technique is generally used to form a color filter layer or an emissive layer of a display device. The inkjet printing may be carried out by ejecting an ink, which is a solution, to a desired location, and then drying the solvent of the ejected ink, so that a target layer is formed.

SUMMARY

Aspects of the present disclosure provide a display device with improved display quality, in which a pixel-defining layer has different taper angles at different areas, thereby reducing deviations in the thickness of emissive layers and preventing a common electrode from being disconnected.

It should be noted that objects of the present disclosure are not limited to the above-mentioned object; and other objects of the present disclosure will be apparent to those skilled in the art from the following descriptions.

According to an aspect of the present disclosure, there is provided a display device including: a substrate comprising a display area and a non-display area, a via layer disposed on the substrate, a pixel electrode disposed on the via layer in the display area, and a pixel-defining layer disposed on the pixel electrode and a part of the via layer exposed by the pixel electrode, wherein the pixel-defining layer comprises a first area disposed in the display area and comprising an opening exposing a part of the pixel electrode, and a second area disposed in the non-display area and comprising an end, and wherein the first area comprises a first side surface defining the opening, wherein the second area comprises a second side surface at the end, wherein a first taper angle which is a taper angle of the first side surface is different from a second taper angle which is a taper angle of the second side surface.

In an embodiment, each of the first and second side surfaces has a tapered shape.

In an embodiment, the first taper angle is greater than the second taper angle.

In an embodiment, the first taper angle is in a range of about 55° to about 85°, and the second taper angle is an acute angle with a range equal to or less than about 50°.

In an embodiment, the second area is disposed to cover a side surface of the via layer.

In an embodiment, the end of the second area is located outside the side surface of the via layer.

In an embodiment, the display device includes an emissive layer disposed on a part of the pixel electrode exposed by the opening; and a common electrode disposed on the emissive layer, wherein the common electrode covers the emissive layer and the pixel-defining layer.

In an embodiment, the display device includes a step auxiliary layer disposed on the substrate in the display area; and a buffer layer disposed on the step auxiliary layer, wherein the via layer is disposed on the buffer layer.

In an embodiment, the via layer has a thickness in a range of about 2 μm to about 10 μm.

In an embodiment, the via layer comprises a first via layer disposed on the substrate and having a first thickness, and a second via layer disposed on the first via layer and having a second thickness, and wherein the first thickness is equal to or greater than the second thickness.

In an embodiment, the first thickness is in a range of about 2 μm to about 5 μm, and the second thickness is in a range of about 2 μm to about 5 μm.

In an embodiment, the pixel-defining layer is liquid-repellant and has a contact angle with water greater than 90° and less than 180°.

In an embodiment, the pixel-defining layer comprises a negative sensitizer.

According to another aspect of the present disclosure, there is provided a display device including: a substrate, a semiconductor layer disposed on the substrate, a first insulating layer disposed on the semiconductor layer; a first conductive layer disposed on the first insulating layer and comprising a gate electrode, a second insulating layer disposed on the first conductive layer, a second conductive layer disposed on the second insulating layer and comprising a supply voltage line, a via layer disposed on the second conductive layer and exposing the supply voltage line, a pixel electrode disposed on the via layer; and a pixel-defining layer disposed on the pixel electrode and a part of the via layer exposed by the pixel electrode, wherein the pixel-defining layer comprises an end disposed between the via layer and the supply voltage line, and an opening exposing a part of the pixel electrode is defined in the pixel-defining layer, and wherein the pixel-defining layer comprises a first side surface defining the opening, and a second side surface at the end, wherein a first taper angle which is a taper angle of the first side surface of the pixel-defining layer is different from a second taper angle which is a taper angle of the second side surface of the pixel-defining layer.

In an embodiment, each of the first side surface and the second side surface of the pixel-defining layer has a tapered shape.

In an embodiment, the first taper angle is greater than the second taper angle.

In an embodiment, the first taper angle is in a range of about 55° to about 85°, and the second taper angle is an acute angle with a range equal to or less than about 50°.

In an embodiment, the pixel-defining layer is disposed to cover an upper surface and a side surface of the via layer exposed by the pixel electrode.

According to another aspect of the present disclosure, there is provided a method of fabricating a display device, the method including: preparing a substrate comprising a display area and a non-display area; forming a transistor in the display area and a supply voltage line in the non-display area on the substrate; forming a via layer on the transistor, the via layer covering the transistor and exposing the supply voltage line; forming a pixel electrode in the display area on the via layer; stacking a material layer for a pixel-defining layer on the substrate, the material layer for a pixel-defining layer covering the pixel electrode; and forming a pixel-defining layer by patterning the material layer using a light mask, the pixel-defining layer comprising an opening exposing a part of the pixel electrode and an end located between the via layer and the supply voltage line, wherein the pixel-defining layer comprises a first side surface defining the opening, and a second side surface at the end, wherein a first taper angle which is a taper angle of the first side surface of the pixel-defining layer is different from a second taper angle which is a taper angle of the second side surface of the pixel-defining layer.

preparing a substrate comprising a display area and a non-display area; forming a transistor in the display area and a supply voltage line in the non-display area on the substrate; forming a via layer over the transistor, the via layer covering the transistor while exposing the supply voltage line; forming a pixel electrode in the display area on the via layer; stacking a material layer for a pixel-defining layer on the substrate, covering the pixel electrode; and forming a pixel-defining layer by patterning the material layer for the pixel-defining layer using a light mask, the pixel-defining layer comprising an opening exposing a part of the pixel electrode and an end located between the via layer and the supply voltage line, wherein a first taper angle of a first side surface of the pixel-defining layer defining the opening is different from a second taper angle of a second side surface of the end of the pixel-defining layer.

The details of one or more embodiments of the subject matter described in this specification are set forth in the accompanying drawings and the description below.

According to an embodiment of the present disclosure, a taper angle of a pixel-defining layer disposed in a display area is different from a taper angle of the pixel-defining layer disposed in a non-display area of a display device, so that the deviations in the thickness of an emissive layer can be reduced in the display area, while a common electrode can be prevented from being disconnected in the non-display area. Accordingly, the display quality of the display device can be improved.

According to an embodiment of the present disclosure, it is possible to induce a level difference between exposed surfaces of the display area and the non-display area by using a difference in height (level) between a via layer in the display area and a via layer in the non-display area in an exposure process during the process of forming the pixel-defining layer. Accordingly, a defocusing effect can be induced by the level difference between the exposed surfaces, so that it is possible to adjust taper angles of the pixel-defining layer in the different areas.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, embodiments of the present disclosure will be described with reference to the accompanying drawings.

Figure 1:
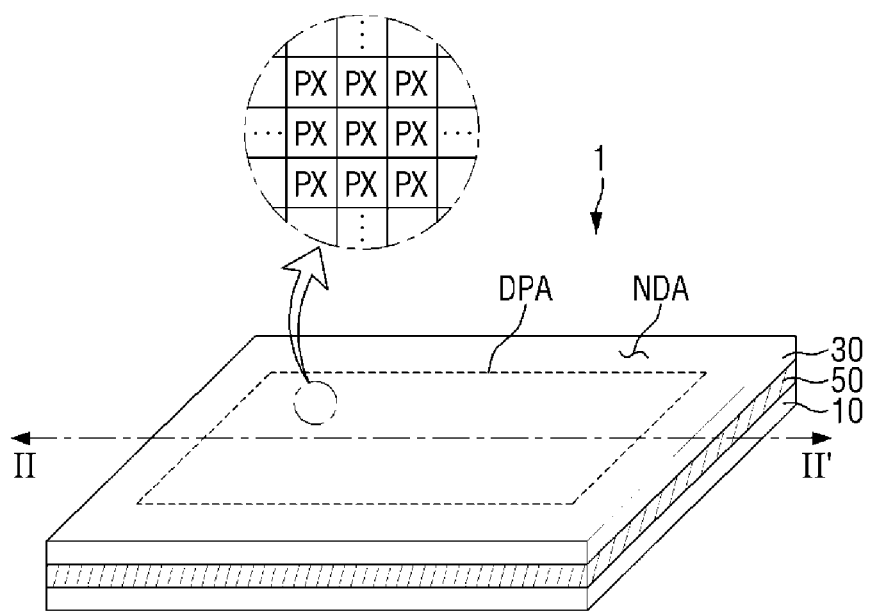
FIG. 1 is a plan view of a display device according to an embodiment of the present disclosure.
Figure 1:
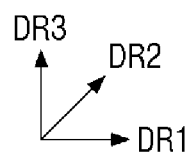
Figure 2:
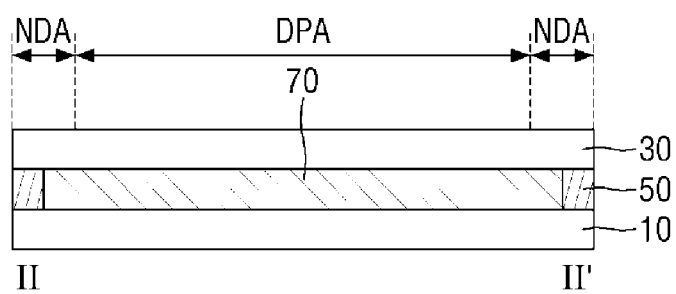
FIG. 2 is a cross-sectional view taken along line II-II' in FIG. 1.
Figure 2:
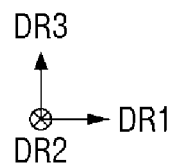

FIG. 1 is a perspective view of a display device according to an embodiment of the present disclosure. FIG. 2 is a cross-sectional view taken along line II-II' of FIG. 1.

Referring to FIGS. 1 and 2, a display device 1 may refer to any electronic device providing a display screen. The display device 1 may include devices for providing a display screen, such as a television set, a laptop computer, a monitor, an electronic billboard, a mobile phone, a smart phone, a tablet personal computer (PC), an electronic watch, a smart watch, a watch phone, a mobile communications terminal, an electronic notebook, an electronic book, a portable multimedia player (PMP), a navigation device, a game console, a digital camera, and the Internet of Things devices.

In the drawings, a first direction DR1, a second direction DR2 and a third direction DR3 are defined. The first direction DR1 may be perpendicular to the second direction DR2 in a plane. The third direction DR3 may be perpendicular to the plane where the first direction DR1 and the second direction DR2 are located. The third direction DR3 may be perpendicular to each of the first direction DR1 and the second direction DR2. In the following description, the third direction DR3 may refer to the thickness direction of a display device 1.

Unless specifically stated otherwise, an upper portion or an upper side indicates the side in the third direction DR3 where images are displayed, and likewise an upper surface indicates the surface facing the side in the third direction DR3. In addition, the lower portion or the lower side indicates the opposite side in the third direction DR3, and likewise the lower surface indicates the surface facing the opposite side in the third direction DR3.

The display device 1 may have a rectangular shape when viewed from the top. For example, the display device 1 may have a rectangular shape having longer sides in the first direction DR1 and shorter sides in the second direction DR2 when viewed from the top. Each of the corners where the longer sides in the first direction DR1 meet the shorter sides in the second direction DR2 may be a right angle or may be rounded with a predetermined curvature. The shape of the display device 1 when viewed from the top is not limited to that shown in the drawings. The display device 1 may have a circular shape or other shapes.

The display device 1 may include a display area DPA where images are displayed, and a non-display area NDA where no image is displayed. The display area DPA may include a plurality of pixels PX. The non-display area NDA may be located around the display area DPA and may surround it.

The display device 1 may include a first display substrate 10 and a second display substrate 30 facing the first display substrate 10. The display device 1 may further include a sealing member 50 that couples the first display substrate 10 with the second display substrate 30, and a filling layer 70 used to fill between the first display substrate 10 and the second display substrate 30.

The first display substrate 10 may output light having a predetermined peak wavelength from a plurality of emission areas in the display area DPA. The first display substrate 10 may include elements and circuits for displaying images. For example, the first display substrate 10 may include pixel circuits such as switching elements, a pixel-defining layer defining an emission area EMA (see FIG. 3) and a non-emission area NEM (see FIG. 3) of the display area DPA, and self-light-emitting elements.

For example, the self-light-emitting element may include at least one of an organic light-emitting diode, a quantum-dot light-emitting diode, an inorganic-based micro light-emitting diode (e.g., micro LED), and an inorganic-based nano light-emitting diode (e.g., nano LED). In the following description, the self-light-emitting element is an organic light-emitting diode as an example.

The second display substrate 30 may be disposed above the first display substrate 10 and may face the first display substrate 10. The second display substrate 30 may transmit the light by converting the peak wavelength of light emitted from the first display substrate 10, or may transmit the light by maintaining the peak wavelength of the light emitted from the first display substrate 10. For example, the first display substrate 10 may emit light having a predetermined peak wavelength, and the second display substrate 30 may transmit at least two or more lights having different peak wavelengths.

The sealing member 50 may be disposed in the non-display area NDA along the edges of the first display substrate 10 and the second display substrate 30 and may be disposed between the first display substrate 10 and the second display substrate 30. The sealing member 50 may surround the display area DPA when viewed from the top. The first display substrate 10 and the second display substrate 30 may be coupled to each other through the sealing member 50. For example, the sealing member 50 may include an organic material. The sealing member 50 may be made of, but is not limited to, an epoxy resin.

The filling layer 70 may be disposed in the space between the first display substrate 10 and the second display substrate 30 surrounded by the sealing member 50. The space between the first display substrate 10 and the second display substrate 30 may be filled with the filling layer 70. The filling layer 70 may be made of a material that transmits light. The filling layer 70 may include an organic material. For example, the filling layer 70 may be made of, but is not limited to, a silicon (Si)-based organic material, an epoxy-based organic material, etc.

Figure 3:
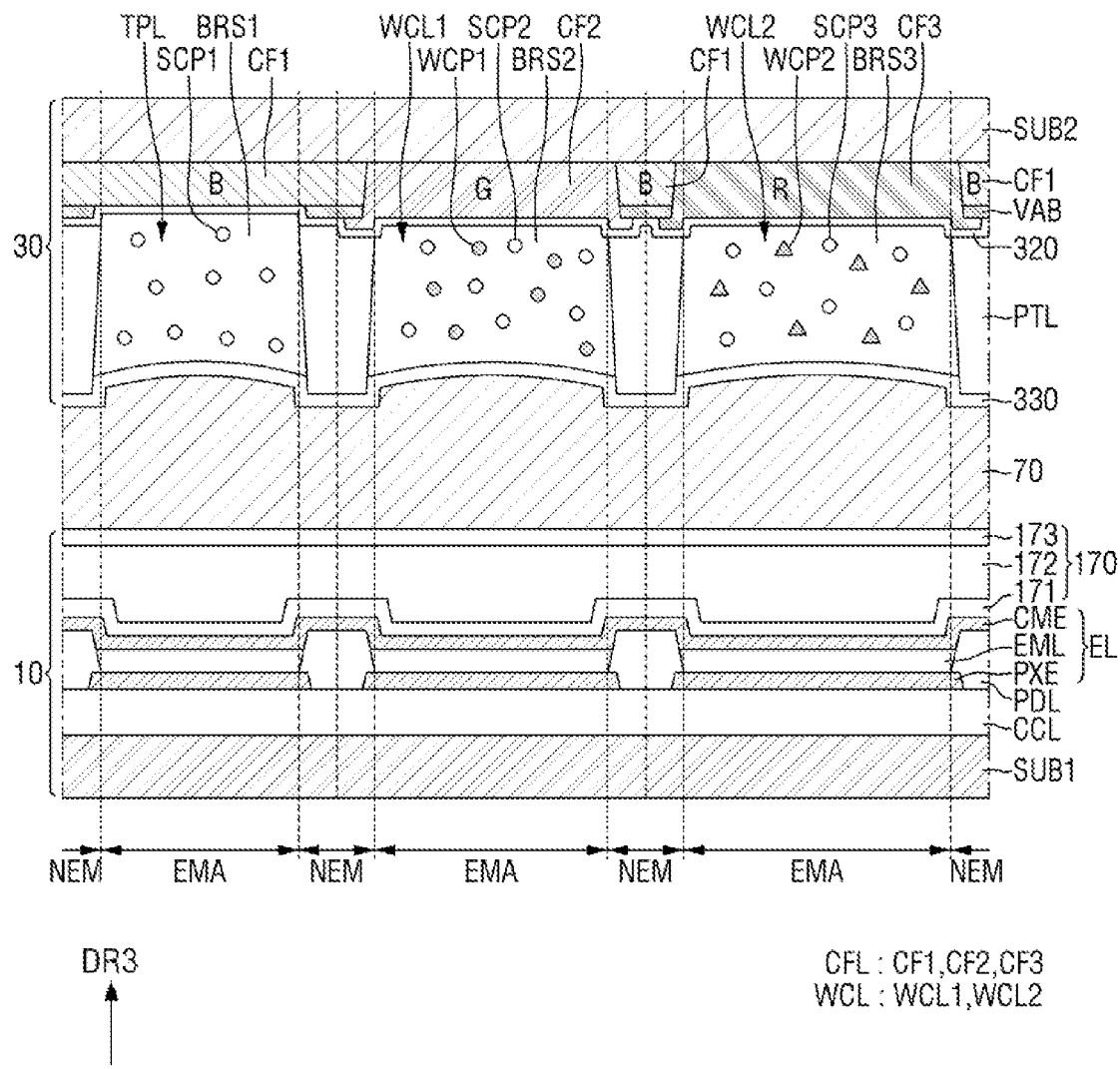
FIG. 3 is a cross-sectional view of a display device according to an embodiment of the present disclosure.

FIG. 3 is a cross-sectional view of a display device according to an embodiment of the present disclosure.

FIG. 3 shows a plurality of layers disposed in the display area DPA of the display device 1. Although FIG. 3 shows a top-emission display device in which light emitted from the emissive layer EML travels toward the side where the second substrate SUB2 is disposed, instead of the side where the first substrate SUB1 is disposed, the display device 1 is not limited thereto.

Referring to FIG. 3, the display device 1 may include the emissive layer EML, a thin-film encapsulation structure 170 covering the emissive layer EML, and color control structures WCL, TPL and CFL disposed above the thin-film encapsulation structure 170. According to an embodiment of the present disclosure, the display device 1 may include the first display substrate 10 and the second display substrate 30 facing the first display substrate 10. The emissive layer EML, the thin-film encapsulation structure 170 and the color control structures WCL, TPL and CFL described above may be included in one of the first display substrate 10 and the second display substrate 30.

For example, the first display substrate 10 may include the first substrate SUB1, a circuit layer CCL disposed on the first substrate SUB1, a plurality of light-emitting elements EL disposed on the circuit layer CCL, and the thin-film encapsulation structure 170 covering the plurality of light-emitting elements EL. The second display substrate 30 may include the second substrate SUB2 and the color control structures CFL, WCL and TPL disposed on the surface of the second substrate SUB2 facing the first substrate SUB1. The color control structures CFL, WCL and TPL may include a wavelength conversion layer WCL and a transparent pattern TPL disposed at the same level with the wavelength conversion layer WCL. The color control structures CFL, WCL and TPL may further include a color filter layer CFL. A filling layer 70 may be disposed between the thin-film encapsulation structure 170 of the first display substrate 10 and the color control structures CFL, WCL and TPL of the second display substrate 30. As described above, the space between the first display substrate 10 and the second display substrate 30 may be filled with the filling layer 70 and they may be coupled together.

The first substrate SUB1 may be an insulating substrate. The first substrate SUB1 may include a transparent material. For example, the first substrate SUB1 may include a transparent insulating material such as glass and quartz. The first substrate SUB1 may be a rigid substrate. It is, however, to be understood that the present disclosure is not limited thereto. The first substrate SUB1 may include plastic such as polyimide (PI) and may have flexible characteristics so that it can be curved, bent, folded or rolled.

The circuit layer CCL may be disposed on a surface of the first substrate SUB1. The circuit layer CCL may include at least one transistor or the like to drive the light-emitting elements EL disposed in each pixel PX. The circuit layer CCL will be described in detail later.

The light-emitting element (or light-emitting diode) EL may be disposed on the circuit layer CCL. The light-emitting element EL may include a pixel electrode PXE, an emissive layer EML, and a common electrode CME. The light emitted from the emissive layer EML may generally pass through the common electrode CME and may exit toward the upper side of the display device 1, i.e., in the third direction DR3.

The first electrode (i.e., the anode electrode) of the light-emitting element EL may be connected to the source electrode of the driving transistor, while the second electrode (i.e., the cathode electrode) thereof may be connected to a second supply voltage line VSS, from which a low-level voltage (second supply voltage) is applied, lower than a high-level voltage (first supply voltage) of a first supply voltage line.

The pixel electrode PXE may be disposed on a surface of the circuit layer CCL. The pixel electrode PXE may be disposed in each of the pixels PX. The pixel electrode PXE of one of the pixels PX may be spaced apart from the pixel electrode of the adjacent one of the pixels. The pixel electrode PXE may be disposed in each emission area EMA defined by the pixel-defining layer PDL to be described later.

The pixel electrode PXE may be a first electrode, e.g., an anode electrode of the light-emitting element EL. The pixel electrode PXE may have a stack structure of a material layer having a high work function such as indium-tin-oxide (ITO), indium-zinc-oxide (IZO), zinc oxide (ZnO) and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca) or a mixture thereof. A material layer having a higher work function may be disposed on a higher layer than a reflective material layer so that it may be closer to the emissive layer EML. The pixel electrodes PXE may have, but is not limited to, a multilayer structure of ITO/Mg, ITO/MgF, ITO/Ag, and ITO/Ag/ITO.

The pixel-defining layer PDL may be disposed on a surface of the circuit layer CCL along the boundary of each pixel PX. The pixel0defining layer PDL may be disposed on the pixel electrode PXE to expose at least a part of the pixel electrode PXE.

An opening exposing at least a part of the pixel electrode PXE may be defined in the pixel-defining layer PDL. Specifically, the opening may be defined by side surfaces (or sidewalls) of the pixel-defining layer PDL, and the opening may expose at least a part of the pixel electrode PXE.

The non-emission area NEM and the emission area EMA may be distinguished by the pixel-defining layer PDL and the opening thereof. In the emission area EMA, the light generated in the emissive layer EML exits to the outside of the display device 1. In the non-emission area NEM, the light generated in the emissive layer EML does not exit to the outside of the display device 1.

The pixel-defining layer PDL may separate and insulate the pixel electrodes PXE of the plurality of light-emitting elements EL from one another. In addition, the pixel-defining layer PDL may work as a bank during an inkjet printing process for forming the emissive layer EML of the process of fabricating the display device 1, so that it is possible to prevent the ink from overflowing to the adjacent pixels PX. In other words, the pixel-defining layer PDL may work as a guide for stably positioning the ink composition for forming the emissive layer EML at a desired location.

The emissive layer EML may be disposed on the pixel electrode PXE exposed by the pixel-defining layer PDL. In an embodiment where the display device 1 is an organic light-emitting display device, the emissive layer EML may include an organic layer including an organic material. The organic layer may include an organic emissive layer EML and may further include hole injection/transport layers and/or electron injection/transport layers as auxiliary layers in some implementations to facilitate emission. In another embodiment where the display device is a micro LED display device, a nano LED display device, etc., the emissive layer EML may include an inorganic material such as an inorganic semiconductor.

In some embodiments, the emissive layer EML may have a tandem structure including a plurality of organic emissive layers overlapping one another in the thickness direction and a charge generation layer disposed therebetween. The organic emissive layers overlapping one another may emit either light of the same wavelength or lights of different wavelengths. At least some layers of the emissive layer EML of each pixel PX may be separated from the counterpart layers of the adjacent pixel PX.

Although not limited thereto, the emissive layer EML may be formed by an inkjet printing utilizing the pixel-defining layer PDL as a bank, as mentioned earlier. In the following description, it is assumed that the emissive layer EML is formed by the inkjet printing.

According to an embodiment of the present disclosure, the emissive layers EML of the different color pixels PX may emit light of the same wavelength. For example, the emissive layer EML of each color pixel PX may emit blue light or ultraviolet light, and the color control structures of the second display substrate 30 may include the wavelength conversion layer WCL and/or the transparent pattern TPL, so that different pixels PX can display lights of different colors.

According to another embodiment of the present disclosure, the emissive layers EML of different color pixels PX may emit lights of different wavelengths. For example, the emissive layer EML of a first color pixel PX may emit light of a first color, the emissive layer EML of a second color pixel PX may emit light of a second color, and the emissive layer EML of a third color pixel PX may emit light of a third color.

A common electrode CME may be disposed on the emissive layer EML. The common electrode CME may be in direct contact with the upper surface of the pixel-defining layer PDL in the non-emission area NEM as well as the emissive layer EML in the emission area EMA.

The common electrode CME may be extended across the pixels PX. The common electrode CME may be disposed on the entire surface across the pixels PX. The common electrode CME may be a second electrode, e.g., a cathode electrode of a light-emitting element EL.

The common electrode CME may include a material layer having a small work function such as Li, Ca, LiF/Ca, LiF/Al, Al, Mg, Ag, Pt, Pd, Ni, Au, Nd, Ir, Cr, BaF and Ba, or a compound or mixture thereof (e.g., a mixture of Ag and Mg). The common electrode CME may further include a transparent metal oxide layer disposed on the material layer having a small work function.

The thin-film encapsulation layer 170 may be disposed on the common electrode CME. The thin-film encapsulation layer 170 can prevent oxygen or moisture from permeating into the light-emitting element EL.

The thin-film encapsulation structure 170 may include at least one thin-film encapsulation layer. For example, the thin-film encapsulation layer may include a first inorganic film 171, an organic film 172, and a second inorganic film 173. Each of the first inorganic film 171 and the second inorganic film 173 may include silicon nitride, silicon oxide, silicon oxynitride, or the like. The organic layer 172 may include an organic insulating material such as polyacrylate resin, epoxy resin, phenolic resin, polyamide resin, polyimide resin, unsaturated polyesters resin, polyphenylene ether resin, polyphenylene sulfide resin, and benzocyclobutene (BCB).

The second display substrate 30 may be disposed above the thin-film encapsulation structure 170 to face it.

The second substrate SUB2 of the second display substrate 30 may include a transparent material. For example, the second substrate SUB2 may include a transparent insulating material such as glass and quartz. The second substrate SUB2 may be a rigid substrate. However, the second substrate SUB2 is not limited by that described above. The second substrate SUB2 may include plastic such as polyimide (PI) and may have flexible characteristics so that it can be curved, bent, folded or rolled.

The second substrate SUB2 may be of the same type as the first substrate SUB1 or may have different material, thickness, transmittance, etc. For example, the second substrate SUB2 may have a higher transmittance than the first substrate SUB1. The second substrate SUB2 may include a light-transmitting material, to allow the light exiting from the emission area EMA to transmit it to the outside of the display device 1. The second substrate SUB2 may be either thicker or thinner than the first substrate SUB1.

Although not shown in the drawings, a buffer layer may be further disposed on the surface of the second substrate SUB2 facing the first substrate SUB1. The buffer layer can prevent impurities from flowing into the surface of the second substrate SUB2.

The color filter layer CFL may be disposed on the surface of the second substrate SUB2 facing the first substrate SUB1. The color filter layer CFL can block the emission of light of a color other than the predetermined color of the pixel PX.

The color filter layer CFL may include a first color filter layer CFL1 disposed in the first color pixel PX, a second color filter layer CFL2 disposed in the second color pixel PX, and a third color filter layer CFL3 disposed in the third color pixel PX. The color filter layer CFL may include a colorant such as a dye and a pigment which absorb wavelengths other than the wavelength of the color it represents.

The first color filter CF1 may be a blue color filter, the second color filter CF2 may be a green color filter, and the third color filter CF3 may be a red color filter. In FIG. 3, the first color filter CF1 is disposed in the emission area EMA of the first color pixel PX and the non-emission area NEM, while the second color filter CF2 and the third color filter CF3 are disposed in the emission areas EMA of the second and third color pixels PX, respectively, and are also partially disposed on the first color filter CF1 disposed in the non-emissive area NEM. It is, however, to be understood that the present disclosure is not limited thereto. For example, the first to third color filters CF1, CF2 and CF3 included in the adjacent pixels PX may be spaced apart from each other.

The first, second, and third color filters CF1, CF2 and CF3 may absorb a part of the light introduced from the outside of the display device 1 to the second display substrate 30 to reduce reflection of external light. Accordingly, the first, second, and third color filters CF1, CF2 and CF3 can prevent color distortion due to reflection of external light.

A light-blocking member VAB may be disposed along the boundary of the pixel PX on the surface of the first color filter CF1 which faces the first substrate SUB1. The light-blocking member VAB may be disposed in the non-emission area NEM to block transmission of light. The light-blocking member VAB may be disposed to surround the emission area EMA of each pixel PX and may have a lattice shape when viewed from the top.

The light-blocking member VAB may include an organic material. The light-blocking member VAB can absorb external light, thereby reducing color distortion due to reflection of external light. In addition, the light-blocking member VAB prevents light from intruding between the adjacent emission areas EMA to result in color mixing, thereby improving the color gamut of the display device 1.

According to an embodiment of the present disclosure, the light-blocking member VAB can absorb all visible wavelengths. The light blocking member VAB may include a light-absorbing material. For example, the light-blocking member VAB may be made of a material used as a black matrix of the display device 1. According to another embodiment, the light-absorbing member UAB may absorb light in a particular wavelength range among the visible light wavelengths and may transmit light in other wavelength ranges. The light-blocking member VAB may be eliminated.

A first capping layer 320 may be disposed on the color filter layer CFL. For example, the first capping layer 320 may be in direct contact with one surface (e.g., the lower surface in FIG. 3) of each of the first to third color filters CF1, CF2 and CF3 disposed in the emission area EMA of each pixel PX in the emission area EMA, and may be in direct contact with the light-blocking member VAB disposed in the non-emission area NEM in the non-emission area NEM.

The first capping layer 320 can prevent impurities such as moisture and air from permeating from the outside to damage or contaminate the color filter layer CFL. In addition, the first capping layer 320 can prevent a colorant included in the color filter layer CFL from diffusing into the wavelength conversion layer WCL and/or the transparent pattern TPL, which will be described later.

The first capping layer 320 may be made of an inorganic material. For example, the first capping layer 320 may include at least one of: silicon nitride, aluminum nitride, zirconium nitride, titanium nitride, hafnium nitride, tantalum nitride, silicon oxide, aluminum oxide, titanium oxide, tin oxide, and silicon oxynitride.

A partition wall PTL may be disposed on the first capping layer 320. The partition wall PTL may overlap with the non-emission area NEM. The partition wall PTL may be disposed so that it overlaps the light-blocking member VAB. The partition wall PTL may be disposed to surround the emission area EMA. The partition wall PTL may include an opening exposing the color filter layer CFL and the transparent pattern TPL.

Color control layers WCL and TPL may be disposed in the space exposed by the opening of the partition wall PTL. According to an embodiment of the present disclosure, the color control layers WCL and TPL may be formed via an inkjet process utilizing the partition wall PTL as a bank. The partition wall PTL may work as a guide for stably positioning the ink composition for forming the color control layers WCL and TPL at a desired location. The partition wall PTL may include, but is not limited to, a photosensitive organic material. The partition wall PTL may further include a light-blocking material.

The color control layers WCL and TPL may include the wavelength conversion layer WCL that convert the wavelength of incident light, and the transparent pattern TPL that transmits incident light without changing the wavelength of the light. The wavelength conversion layer WCL or the transparent pattern TPL may be disposed separately in each of the pixel PX. The wavelength conversion layer WCL or the transparent pattern TPL may overlap with the emission areas EMA in the thickness direction of the display device 1. The wavelength conversion layer WCL and/or the transparent pattern TPL disposed adjacent to each other may be spaced apart from each other by the partition wall PTL disposed in the non-emission area NEM.

The wavelength conversion layer WCL may be disposed in a pixel SPX with a color different from the wavelength of light incident from the light-emitting element EL so as to change the wavelength. The transparent pattern TPL may be disposed in a pixel PX with a color corresponding to the wavelength of the light incident from the light-emitting element EL. According to the illustrated embodiment where the emissive layer EML of each pixel PX emits light of the first color, the transparent pattern TPL is disposed in the first color pixel PX, while the wavelength conversion layer WCL is disposed in each of the second color pixel PX and the fourth color pixel PX. As another example, when the light-emitting element EL of each pixel PX emits light having a wavelength different from the color of the pixel PX, such as ultraviolet rays, only the wavelength conversion layer WCL may be disposed in the pixel PX without the transparent pattern TPL.

According to an embodiment of the present disclosure, the wavelength conversion layer WCL may include a first wavelength conversion pattern WCL1 disposed in the second color pixel PX, and a second wavelength conversion pattern WCL2 disposed in the third color pixel PX.

The transparent pattern TPL may be disposed in the space partitioned by the partition wall PTL in the emission area EMA of the first color pixel PX. The transparent pattern TPL may overlap with the first color filter CF1. The transparent pattern TPL transmits the light of the first color incident from the emissive layer EML while maintaining the wavelength of it. For example, the transparent pattern TPL transmits blue light incident from the emissive layer EML while maintaining its wavelength.

The transparent pattern TPL may include a first base resin BRS1. The transparent pattern TPL may further include first scattering particles SCP1 dispersed in the first base resin BRS1.

The first view conversion pattern WCL1 may be disposed in the space partitioned by the partition wall PTL in the emission area EMA of the second color pixel PX. The first wavelength conversion pattern WCL1 may overlap with the second color filter CF2. The first wavelength conversion pattern WCL1 may convert light that has the wavelength of the first color and is incident from the emissive layer EML into light having the wavelength of the second color different from the first color and then output it. For example, the first wavelength conversion pattern WCL1 may convert blue light incident from the emissive layer EML into green light and then output it.

The first wavelength conversion pattern WCL1 may include a second base resin BRS2, and first wavelength-converting particles WCP1 dispersed in the second base resin BRS2. The first wavelength conversion pattern WCL1 may further include second scattering particles SCP2 dispersed in the second base resin BRS2.

The second wavelength conversion pattern WCL2 may be disposed in the space partitioned by the partition wall PTL in the emission area EMA of the third color pixel PX. The second wavelength conversion pattern WCL2 may overlap with the third color filter CF3. The second wavelength conversion pattern WCL2 may convert light that has the wavelength of the first color and is incident from the emissive layer EML into light having the wavelength of the third color different from the first color and then output it. For example, the second wavelength conversion pattern WCL2 may convert blue light incident from the emissive layer EML into red light and then output it.

The second wavelength conversion pattern WCL2 may include a third base resin BRS3 and second wavelength-converting particles WCP2 dispersed in the third base resin BRS3. The second wavelength conversion pattern WCL2 may further include third scattering particles SCP3 dispersed in the third base resin BRS3.

The first, second, and third base resins BRS1, BRS2 and BRS3 may include a transparent organic material. For example, the first to third base resins BRS1, BRS2 and BRS3 may include an epoxy resin, an acrylic resin, a cardo resin, an imide resin, or the like. The first, second, and third base resins BRS1, BRS2 and BRS3 may be made of, but is not limited to, the same material The first to third scattering particles SCP1, SCP2 and SCP3 may have refractive indexes different from those of the first, second, and third base resins BRS1, BRS2 and BRS3. The first, second, and third scattering particles SCP1, SCP2 and SCP3 may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc. Examples of the material of the organic particles may include an acrylic resin, a urethane resin, etc. The first, second, and third scattering particles SCP1, SCP2 and SCP3 may be made of, but is not limited to, the same material.

The first wavelength-converting particles WCP1 may convert the first color into the second color, and the second wavelength-converting particles WCP2 may convert the first color into the third color. For example, the first wavelength-converting particles WCP1 may convert blue light into green light, and the second wavelength-converting particles WCP2 may convert blue light into red light. The first wavelength-converting particles WCP1 and the second wavelength-converting particles WCP2 may be quantum dots, quantum rods, phosphors, etc. The quantum dots may include IV nanocrystals, II-VI compound nanocrystals, III-V compound nanocrystals, IV-VI nanocrystals, or combinations thereof.

A second capping layer 330 is disposed on the wavelength conversion layer WCL and the transparent pattern TPL. The second capping layer 330 may be made of an inorganic material. The second capping layer 330 may include a material selected from among the materials listed above as materials of the first capping layer 320. The second capping layer 330 and the first capping layer 320 may be made of, but is not limited to, the same material.

The second capping layer 330 may cover the wavelength conversion patterns WCL1 and WCL2 and the transparent pattern TPL. The second capping layer 330 may cover one surface of each of the wavelength conversion patterns WCL1 and WCL2 and the transparent pattern TPL as well as the side surfaces thereof. The second capping layer 330 may be in direct contact with the partition wall PTL in the space between the adjacent color control layers WCL and TPL. The second capping layer 330 may have a shape conforming to a surface level difference formed by the color control layers WCL and TPL.

The filling layer 70 may be interposed between the first display substrate 10 and the second display substrate 30. The space between the first display substrate 10 and the second display substrate 30 may be filled with the filling layer 70, and they may be coupled with each other by the filling layer 50. The filler layer 70 may be disposed between the thin-film encapsulation structure 170 of the first display substrate 10 and the second capping layer 330 of the second display substrate 30. The filler layer 70 may be made of, but is not limited to, a Si-based organic material, an epoxy-based organic material, etc.

Hereinafter, a cross-sectional structure of the first display substrate 10 of the display device 1 will be described in detail.

Figure 4:
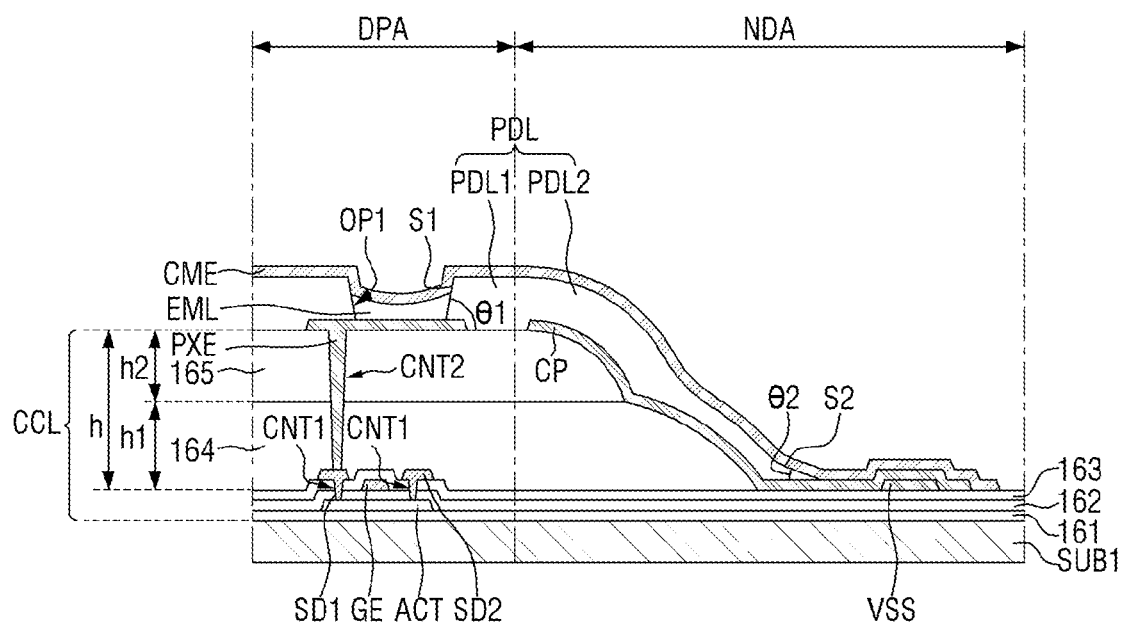
FIG. 4 is a cross-sectional view of a first display substrate of a display device according to an embodiment.

FIG. 4 is a cross-sectional view of a first display substrate of a display device according to an embodiment. In FIG. 4, a cross section of a part of the display area DPA along with a part of the non-display area NDA are shown.

A first substrate SUB1 may include a display area DPA and a non-display area NDA.

A circuit layer CCL may be disposed on the first substrate SUB1. The circuit layer CCL may be disposed in the display area DPA and the non-display area NDA.

The circuit layer CCL may include a buffer layer 161, a semiconductor layer ACT, a first insulating layer 162, a first conductive layer 120, a second insulating layer 163, a second conductive layer 130, a first via layer 164 and a second via layer 165.

Each of the layers described above may be made up of a single layer, or a stack of layers including a plurality of layers. Other layers may be further disposed between the layers.

The buffer layer 161 may be disposed on the first substrate SUB1. The buffer layer 161 may be disposed generally over the front surface of the first substrate SUB1. The buffer layer 161 can prevent impurity ions from diffusing, can prevent permeation of moisture, and can provide a flat surface. The buffer layer 161 may include silicon nitride, silicon oxide, silicon oxynitride, or the like.

The semiconductor layer ACT may be disposed on the buffer layer 161. The semiconductor layer ACT forms the channels of a plurality of transistors TR of pixels. The semiconductor layer ACT may include polycrystalline silicon. The polycrystalline silicon may be formed by crystallizing amorphous silicon.

When the semiconductor layer ACT is made of polycrystalline silicon by doping ions into the semiconductor layer ACT, the semiconductor layer ACT can have conductivity. Accordingly, the semiconductor layer ACT may include a source region and a drain region as well as the channel region of each of the plurality of transistors. The source region and the drain region may be connected to both sides of each channel region.

According to another embodiment, the semiconductor layer ACT may include monocrystalline silicon, low-temperature polycrystalline silicon, amorphous silicon, or an oxide semiconductor. The oxide semiconductor may include, for example, a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), etc. According to an embodiment of the present disclosure, the semiconductor layer ACT may include an oxide including indium, tin and titanium (ITZO) or an oxide including indium, gallium and tin (IGZO).

The first insulating layer 162 may be disposed on the semiconductor layer ACT and the buffer layer 161. The first insulating layer 162 may be disposed generally over the front surface of the first substrate SUB1. The first insulating layer 162 may be a gate insulating layer having a gate insulating function. The first insulating layer 162 may include a silicon compound, a metal oxide, etc. For example, the first insulating layer 162 may include silicon oxide, silicon nitride, silicon oxynitride, aluminum oxide, tantalum oxide, hafnium oxide, zirconium oxide, titanium oxide, etc. The first insulating layer 162 may be made up of a single layer or multiple layers of different materials stacked on one another.

The first conductive layer 120 may be disposed on the first insulating layer 162. The first conductive layer 120 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) and copper (Cu). The first conductive layer 120 may be made up of a single layer or multiple layers.

The first conductive layer 120 may include the gate electrode GE of the transistor TR. Although not shown in the drawings, the first conductive layer 120 may further include a first electrode of a capacitor.

The second insulating layer 163 may be disposed on the first conductive layer 120 and the first insulating layer 162. The second insulating layer 163 may be disposed over the front surface of the first substrate SUB1. The second insulating layer 163 may insulate the first conductive layer 120 from the second conductive layer 130. The second insulating layer 163 may be an interlayer dielectric layer. The second insulating layer 163 may include the same material as the first insulating layer 162 or may include one or more materials selected from the materials listed above as the materials of the first insulating layer 162.

The second conductive layer 130 may be disposed on the second insulating layer 163. The second conductive layer 130 may include at least one metal selected from the group consisting of: aluminum (Al), molybdenum (Mo), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W) and copper (Cu). The second conductive layer 130 may be made up of a single layer or multiple layers. For example, the second conductive layer 130 may have a stack structure of Ti/Al/Ti, Mo/Al/Mo, Mo/AlGe/Mo, and Ti/Cu.

The second conductive layer 130 may include a signal line, a second supply voltage line VSS, and a first electrode SD1 and a second electrode SD2 of a transistor TR.

The first electrode SD1 of the transistor TR and the second electrode SD2 of the transistor TR may be disposed in the display area DPA. The first electrode SD1 and the second electrode SD2 of the transistor TR may be electrically connected to the semiconductor layer ACT through first contact holes CNT1 penetrating the first insulating layer 162 and the second insulating layer 163. Specifically, the first electrode SD1 and the second electrode SD2 of the transistor TR may be electrically connected to a source region and a drain region of the semiconductor layer ACT through the first contact holes CNT1 penetrating the first insulating layer 162 and the second insulating layer 163, respectively.

The second supply voltage line VSS may be disposed in the non-display area NDA. The second supply voltage line VSS may be a supply voltage line that supplies the low-level voltage (the second supply voltage) lower than the high-level voltage (the first supply voltage) to the second electrode of the light-emitting element EL, i.e., the common electrode CME. The second supply voltage line VSS may be electrically connected to the common electrode CME in the non-display area NDA to apply the second supply voltage to the common electrode CME.

The via layers 164 and 165 may be disposed on the second conductive layer 130. The via layers 164 and 165 may be disposed in the display area DPA and the non-display area NDA. The via layers 164 and 165 may cover the first electrode SD1 and the second electrode SD2 of the transistor TR in the display area DPA and may expose the second supply voltage line VSS in the non-display area NDA. At least, each of the side surfaces of the via layers 164 and 165 may be located in the non-display area NDA. That is, the via layers 164 and 165 extend from the non-display area NDA to the display area DPA.

In the display area DPA, the via layers 164 and 165 may have a substantially flat surface regardless of the shape or presence of patterns disposed thereunder. In other words, the via layers 164 and 165 can provide a flat surface over level differences created by the shape or the presence of the patterns disposed thereunder.

In addition, the via layers 164 and 165 may have a predetermined thickness h so that a high level difference is made between an area in which the via layers 164 and 165 are disposed and an area in which they are not disposed. Specifically, the via layers 164 and 165 may have the predetermined thickness h so that a high level difference (or height difference) is made between the area in which the via layers 164 and 165 are disposed at some areas of the display area DPA and the non-display area NDA and the area in which they are not disposed in the non-display area NDA. The level difference created by the via layers 164 and 165 having the predetermined thickness can induce a level difference between the exposed surfaces at different areas in the exposure process during the process of forming the pixel-defining layer PDL, which will be described later. Accordingly, defocusing effect is induced by the level difference between the exposed surfaces, so that it is possible to adjust taper angles of the pixel-defining layer PDL at the different areas. A detailed description thereon will be given later.

The via layers 164 and 165 may include a first via layer 164 and a second via layer 165.

The first via layer 164 may be disposed on the second conductive layer 130. The first via layer 164 may be disposed in the display area DPA and the non-display area NDA. The first via layer 164 may be disposed to cover the first electrode SD1 and the second electrode SD2 of the transistor TR in the display area DPA. The first via layer 164 may be disposed to expose the second supply voltage line VSS in the non-display area NDA.

The first via layer 164 may include a gradually lowering side surface in the non-display area NDA. The thickness of the first via layer 164 may decrease from the display area DPA to the non-display area NDA. The side surface of the first via layer 164 may be located in the non-display area NDA as shown in FIG. 4. It is, however, to be understood that the present disclosure is not limited thereto. The side surface of the first via layer 164 may be extended across the display area DPA and the non-display area NDA. Specifically, the height of the first via layer 164 may decrease gradually toward the outside from in the non-display area NDA or from the edge of the display area DPA adjacent to the boundary between the display area DPA and the non-display area NDA. In such case, the thicknesses (or heights) of the first via layer 164 may be compared with each other based on the height (or distance) between the surfaces and the same flat reference surface without any structure disposed thereunder (for example, the upper surface of the buffer layer 161).

In the display area DPA, the first via layer 164 may have a substantially flat surface regardless of the shape or presence of patterns disposed thereunder. In other words, the first via layer 164 can provide a flat surface over level differences of the patterns disposed thereunder.

The first via layer 164 is required to have a sufficient thickness in order to provide a flat surface over the level differences formed by multiple layers disposed thereunder. In addition, as described above, the first via layer 164 is required to have a sufficient thickness in order to form a high level difference between the area in which the via layers 164 and 165 are formed in the non-display area NDA and the area in which the via layers 164 and 165 a formed in the display area DPA. The thickness h1 of the first via layer 164 in the display area DPA may range from, but is not limited to, about 2 μm to about 5 μm.

The first via layer 164 may include an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB).

The second via layer 165 may be disposed on the first via layer 164. The second via layer 165 may be disposed in the display area DPA and the non-display area NDA. The second via layer 165 may be disposed on the first via layer 164 but not on the side surface of the first via layer 164. Specifically, the second via layer 165 may be disposed on the upper surface of the first via layer 164, and the side surface of the second via layer 165 may be located in the non-display area NDA, more to the inside than the side surface of the first via layer 164. That is, the second via layer 165 may be disposed on the upper surface of the first via layer 164 in the display area DPA and the non-display area NDA but not on the side surface of the first via layer 164 disposed in the non-display area NDA. Thus, the portion of the second via layer 165 disposed in the non-display area NDA is shorter than the portion the first via layer 164 disposed in the non-display area NDA. Like the first via layer 164, the second via layer 165 may be disposed to expose the second supply voltage line VSS in the non-display area NDA.

The second via layer 165 may include a gradually lowering side surface in the non-display area NDA. Similarly to the first via layer 164, the thickness of the second via layer 165 may decrease from the display area DPA to the non-display area NDA. The side surface of the second via layer 165 may be located in the non-display area NDA as shown in FIG. 4. It is, however, to be understood that the present disclosure is not limited thereto. The side surface of the second via layer 165 may be extended across the display area DPA and the non-display area NDA. Specifically, the height of the second via layer 165 may decrease gradually toward the outside from in the non-display area NDA or from the edge of the display area DPA adjacent to the boundary between the display area DPA and the non-display area NDA.

The second via layer 165 may be disposed on the first via layer 164 to stably provide a flat surface over the level differences formed under the first via layer 164. In addition, as described above, the second via layer 165 may assist the first via layer 164 to have a high level difference in order to form a high level difference between the area in which the via layers 164 and 165 are formed and the area in which they are not formed. The thickness h2 of the second via layer 165 may be equal to or less than the thickness h1 of the first via layer 164. The thickness h2 of the second via layer 165 in the display area DPA may range from, but is not limited to, about 2 μm to about 5 μm. Although the thickness h2 of the second via layer 165 is smaller than the thickness h1 of the first via layer 164 in the example shown in FIG. 4, the present disclosure is not limited thereto. The thickness h2 of the second via layer 165 may be equal to the thickness h1 of the first via layer 164.

The second via layer 165 may include an organic insulating material. The second via layer 165 may include one or more selected from the materials listed above as the constituent materials of the first via layer 127.

The third conductive layer 140 may be disposed on the via layers 164 and 165. Specifically, the third conductive layer 140 may be disposed on the second via layer 165. The third conductive layer 140 may have a stack structure of a material layer having a high work function such as indium-tin-oxide (ITO), indium-zinc-oxide (IZO), zinc oxide (ZnO) and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Jr), chromium (Cr), lithium (Li), calcium (Ca) or a mixture thereof. A material layer having a higher work function may be disposed on a higher layer than a reflective material layer so that it may be closer to the emissive layer EML. The third conductive layer 140 may have, but is not limited to, a multilayer structure of ITO/Mg, ITO/MgF, ITO/Ag, and ITO/Ag/ITO.

The third conductive layer 140 may include a pixel electrode PXE and a conductive pattern CP.

The pixel electrode PXE may be disposed in the display area DPA but not in the non-display area NDA. The pixel electrode PXE may be a first electrode, e.g., an anode electrode of the light-emitting element EL, as described above. The pixel electrode PXE may be connected to the first electrode SD1 of the transistor TR through a second contact hole CNT2 penetrating the first via layer 164 and the second via layer 165.

The conductive pattern CP may be disposed in the non-display area NDA. The conductive pattern CP may be disposed on the upper and side surfaces of the second via layer 165 in the non-display area NDA, and may be extended outward to be disposed on the side surface of the first via layer 164. The conductive pattern CP may be extended outward from the side surfaces of the first via layer 164 and the second via layer 165 to be electrically connected to the second supply voltage line VSS disposed in the non-display area NDA. The conductive pattern CP may be disposed above the second supply voltage line VSS to cover the second supply voltage line VSS. The conductive pattern CP may be disposed between the second supply voltage line VSS and the common electrode CME to electrically connect the second supply voltage line VSS with the common electrode CME. In addition, the conductive pattern CP may protect the second supply voltage line VSS disposed under the conductive pattern CP. It is, however, to be understood that the present disclosure is not limited thereto. The conductive pattern CP may be eliminated.

A pixel-defining layer PDL may be disposed on the first via layer 164 and the second via layer 165. The pixel-defining layer PDL may be disposed in the display area DPA and the non-display area NDA. The pixel-defining layer PDL may cover the second via layer 165 in the display area DPA. In the non-display area NDA, the pixel-defining layer PDL may be disposed to cover the upper and side surfaces of the second via layer 165 and the side surface of the first via layer 164, and expose the second supply voltage line VSS.

The pixel-defining layer PDL may include an organic insulating material or an inorganic insulating material. For example, the pixel-defining layer PDL may include at least one of: a polyimide resin, an acrylic resin, a silicon compound, a polyacrylic resin, and the like. The pixel-defining layer PDL may further include a negative photosensitive material (sensitizer).

The pixel-defining layer PDL may be liquid repellent. Although not limited thereto, the pixel-defining layer PDL may include a liquid-repellent material. The pixel-defining layer PDL may include any compound having liquid repellency. For example, it may include, but is not limited thereto, a fluorine-based compound or a siloxane-based compound.

As used herein, the term liquid repellent refers to a property that repels a solution and does not allow the solution to permeate therethrough. The term liquid attractive, on the other hand, refers to a property that has excellent affinity for a solution. For example, a solution may have a low adhesive force with a liquid-repellent surface, and the surface tension of the solution located on the liquid-repellent surface may increase. On the other hand, a solution may have an excellent adhesive force with a liquid-attractive surface, and the surface tension of the solution located on the liquid-attractive surface may decrease.

When a solution is located on a liquid-repellent surface, the solution may have a contact angle greater than that of the solution located on a liquid-attractive surface. The contact angle may refer to an angle formed by a tangent line of a solution located on a surface at the contact point and the surface. The contact angle may increase with the liquid repellency or the surface tension. Although not limited thereto, for example, when water is located on a liquid-repellent surface, the contact angle of the water on the surface may be greater than 90° and less than 180°. In addition, when water is located on a liquid-attractive surface, the contact angle of the water on the surface may be greater than 0° and less than 90°.

As the pixel-defining layer PDL is liquid repellent, when an emissive layer EML is formed using an inkjet printing process in which an ink containing a material for the emissive layer is ejected during a process of fabricating a display device, the pixel-defining layer PDL may prevent the ink from overflowing to adjacent pixels PX and guide the ink composition so that it is located at a desired location stably.

The pixel-defining layer PDL may include a first area PDL1 disposed in the display area DPA and a second area PDL2 disposed in the non-display area NDA. The first area PDL1 and the second area PDL2 of the pixel-defining layer PDL may be formed integrally.

The first area PDL1 of the pixel-defining layer PDL may be disposed in the display area DPA. The first area PDL1 of the pixel-defining layer PDL may be formed along the boundary of the pixel PX in the display area DPA and may partially overlap the pixel electrode PXE. At least a part of the first area PDL1 of the pixel-defining layer PDL overlaps the pixel electrode PXE, and the other part thereof may be located in the non-emission area NEM (see FIG. 3) in the display area DPA and may not overlap the pixel electrode PXE. The first area PDL1 of the pixel-defining layer PDL may also be disposed on a part of the second via layer 165 where the pixel electrode PXE is not formed.

An opening OP1 exposing a part of the pixel electrode PXE is defined in the first area PDL1 of the pixel-defining layer PDL. The first area PDL1 of the pixel-defining layer PDL may include a side surface or a sidewall S1 associated with the opening OP1. That is, the opening OP1 may be defined by the first side surface S1 of the first area PDL1 of the pixel-defining layer PDL.

According to an embodiment of the present disclosure, the first side surface Si of the first area PDL1 of the pixel-defining layer PDL may have a tapered shape. Herein, the tapered shape refers to a shape having the lower surface protrudes than the upper surface in cross section and has an inclined side surface. Specifically, when the cross-sectional shape is a tapered shape, the angle formed by the plane on which the lower surface is located and the side surface may be an acute angle. On the other hand, a reverse tapered shape refers to a shape having the upper surface protrudes than the lower surface in cross section and has an inclined side surface. Specifically, when the cross-sectional shape is a reverse tapered shape, the angle formed by the plane on which the lower surface is located and the side surface may be an obtuse angle.

According to an embodiment of the present disclosure, the first side surface Si of the first area PDL1 of the pixel-defining layer PDL may have a tapered shape. Accordingly, the angle formed by the plane on which the lower surface of the first area PDL1 of the pixel-defining layer PDL and the first side surface Si may be an acute angle. The angle formed by the plane on which the lower surface of the first area PDL1 of the pixel-defining layer PDL is located and the first side surface Si may be defined as a first taper angle $\theta 1$.

The emissive layer EML to be described later may be disposed in the opening OP1 associated with the first side surface S1 of the first area PDL1 of the pixel-defining layer PDL. In such case, the emissive layer EML may be formed by ejecting an ink composition onto the opening OP1 by inkjet printing. The thickness of the emissive layer EML disposed in the opening OP1 of each pixel PX may be determined depending on the amount of ejected ink and/or the drop placement accuracy. If deviations in the thickness of the emissive layers EML disposed in the pixels PX are large, the display quality of the display device 1 may be deteriorated. Accordingly, it is necessary to design a cross-sectional structure of the opening OP1 in which the emissive layer EML is disposed so that deviations in the thickness of the emissive layers EML in the pixels PX depending on the amount of ejected ink are reduced. Incidentally, it is possible to adjust deviations in the thickness of the emissive layers EML depending on changes in the amount of ejected ink by adjusting the taper angle of the first area PDL1 of the pixel-defining layer PDL defining the opening OP1 in which the emissive layer EML is disposed. Specifically, as the first taper angle $\theta 1$ formed by the first side surface S1 of the first area PDL1 of the pixel-defining layer PDL increases, deviations in the thickness of the emissive layers EML may decrease depending on the amount of the ejected ink. Accordingly, by increasing the first taper angle $\theta 1$ of the first side Si of the first area PDL1 of the pixel-defining layer PDL, it is possible to reduce variations in the thickness of the emission layers EML depending on the amount of the ejected ink.

According to an embodiment of the present disclosure, in order to reduce deviations in the thickness of the emissive layers EML of the pixels PX, the first taper angle $\theta 1$ formed by the first side surface S1 of the first area PDL1 of the pixel-defining layer PDL may have, but is not limited to, a range of about 55° to about 85°, and preferably a range of about 70° to about 80°.

The second area PDL2 of the pixel-defining layer PDL may be disposed in the non-display area NDA. The second area PDL2 of the pixel-defining layer PDL may be disposed to cover side surfaces (or ends when viewed from the top) of the first via layer 164 and the second via layer 165 disposed in the non-display area NDA. The second area PDL2 of the pixel-defining layer PDL may cover the side surfaces (or the ends when viewed from the top) of the first via layer 164 and the second via layer 165 and may be extended outward, exposing at least a part of the conductive pattern CP. The part of the conductive pattern CP exposed by the second area PDL2 of the pixel-defining layer PDL may overlap the second supply voltage line VSS.

The end (or side surface S2) of the second area PDL2 of the pixel-defining layer PDL may be disposed on the conductive pattern CP. The end of the second area PDL2 of the pixel-defining layer PDL may be located on the second insulating layer 163 exposed by the first and second via layers 164 and 165. The end of the second area PDL2 of the pixel-defining layer PDL may not overlap the side surfaces of the first and second via layers 164 and 165.

The second area PDL2 of the pixel-defining layer PDL disposed on the side surfaces of the first and second via layers 164 and 165 may include a gradually lowering side surface. As the second area PDL2 of the pixel-defining layer PDL is disposed on the lowering side surfaces of the first and second via layers 164 and 165, the height of the second area PDL2 (or the height of the surface) of the pixel-defining layer PDL may decrease toward the outer side. The thickness of the second area PDL2 of the pixel-defining layer PDL may decrease from the non-display area NDA toward the outer side (i.e., from the display area DPA to the side where the non-display area NDA is disposed).

The second side surface S2 of the second area PDL2 of the pixel-defining layer PDL may have a tapered shape. According to an embodiment of the present disclosure, the cross-sectional shape of the end of the second area PDL2 of the pixel-defining layer PDL may have a tapered shape. Accordingly, the angle formed by the plane on which the lower surface is located at the end of the second area PDL2 of the pixel-defining layer PDL and the second side surface S2 may be an acute angle. The angle formed by the plane on which the lower surface of the second area PDL2 of the pixel-defining layer PDL is located and the second side surface S2 may be defined as a second taper angle $\theta 2$.

The second taper angle $\theta 2$ of the second side surface S2 of the second area PDL2 of the pixel-defining layer PDL may be different from the first taper angle $\theta 1$ of the first side surface S1 of the first area PDL1 of the pixel-defining layer PDL. According to an embodiment of the present disclosure, the second taper angle $\theta 2$ may be smaller than the first taper angle $\theta 1$. According to an embodiment of the present disclosure, the second taper angle $\theta 2$ may be, but is not limited to, an acute angle equal to or less than about 50°, and preferably may have a range of about 20° to about 50°.

The emissive layer EML may be disposed on the pixel electrode PXE exposed by the pixel-defining layer PDL (specifically, the first area PDL1 of the pixel-defining layer PDL). The emissive layer EML may be disposed in the opening OP1 included in the pixel-defining layer PDL in the display area DPA. In an embodiment where the display device 1 is an organic light-emitting display device, the emissive layer EML may include an organic layer including an organic material. The organic layer includes an organic, emissive layer and may further include hole injection/transport layers and/or electron injection/transport layers as auxiliary layers in some implementations to facilitate emission. In another embodiment where the display device 1 is an LED display device, etc., the emissive layer EML may include an inorganic material such as an inorganic semiconductor. The emissive layer EML may be formed by, but is not limited to, inkjet printing.

A common electrode CME may be disposed on the emissive layer EML and the pixel-defining layer PDL. The common electrode CME may be in direct contact with the emissive layer EML as well as the upper surface of the pixel-defining layer PDL.

The common electrode CME may be extended across the pixels PX. The common electrode CME may be disposed on the entire surface across the pixels PX. The common electrode CME may be disposed throughout the entire display area DPA and may be electrically connected to the conductive pattern CP exposed by the pixel-defining layer PDL in the non-display area NDA. The common electrode CME may be electrically connected to the second supply voltage line VSS through the conductive pattern CP in the non-display area NDA. The common electrode CME may be a second electrode of the light-emitting diode, i.e., a cathode electrode.

The common electrode CME may include a material layer having a small work function such as Li, Ca, LiF/Ca, LiF/Al, Al, Mg, Ag, Pt, Pd, Ni, Au, Nd, Jr, Cr, BaF and Ba, or a compound or mixture thereof (e.g., a mixture of Ag and Mg). The common electrode CME may further include a transparent metal oxide layer disposed on the material layer having a small work function.

The pixel electrode PXE, the emissive layer EML and the common electrode CME may form a light-emitting element (e.g., an organic light-emitting element). Light emitted from the emissive layer EML may pass through the common electrode CME to exit upward.

The display device 1 according to this embodiment may include the via layers 164 and 165 having a predetermined thickness h, and the pixel-defining layer PDL disposed on the via layers 164 and 165 to cover the upper and side surfaces of the via layers 164 and 165. The pixel-defining layer PDL may be disposed. The pixel-defining layer PDL may include the first area PDL1 where the opening OP1 exposing the pixel electrode PXE is defined, and the second area PDL2 disposed the non-display area NDA and exposing the conductive pattern CP electrically connected to the second supply voltage line VSS. Incidentally, as the first taper angle θ1 of the first side surface S1 of the first area PDL1 of the pixel-defining layer PDL is large, deviations in the thickness of the emissive layers EML can decrease, so that the display quality of the display device 1 can be improved. On the other hand, if the second taper angle θ2 of the second side surface S2 of the second area PDL2 of the pixel-defining layer PDL is equal to the first taper angle θ1, the common electrode CME disposed on the pixel-defining layer PDL may be disconnected in the non-display area NDA during the process of forming the common electrode CME due to the high taper angle, resulting a defect in the display device 1. Accordingly, the display device 1 according to this embodiment includes the pixel-defining layer PDL having different taper angles of the first side surface S1 of the first area PDL1 and the second side surface S2 of the second area PDL2, so that deviations in the thickness of the emission layers EML can be reduced. By doing so, the display reliability can be improved, and any defects of the common electrode CME in the non-display area NDA can be reduced, providing the display device 1 with improved display quality.

Hereinafter, a method of fabricating the display device 1 described above will be described.

FIGS. 5, 6, 7, 8, 9, 10, and 11 are cross-sectional views showing processing steps of a method of fabricating the display device shown in FIG. 4.

Figure 5:
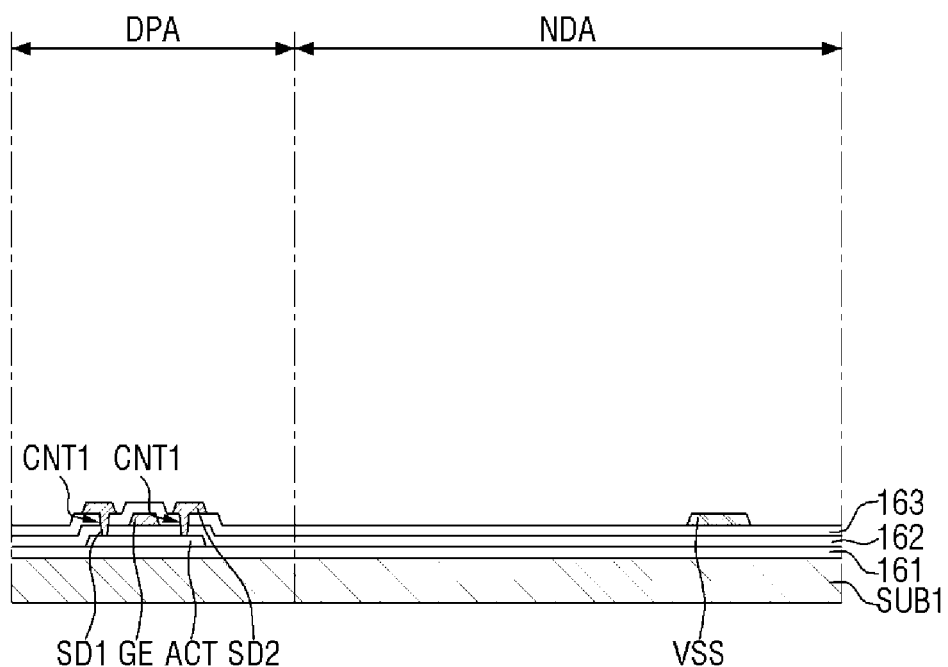
FIGS. 5, 6, 7, 8, 9, 10, and 11 are cross-sectional views showing processing steps of a method of fabricating the display device shown in FIG. 4.

Initially, referring to FIG. 5, a transistor TR and a second supply voltage line VSS are formed on a first substrate SUB1.

Specifically, a buffer layer 161 is formed on the front surface of the first substrate SUB1. Subsequently, a semiconductor layer ACT is formed on the buffer layer 161. The semiconductor layer ACT may be formed via a mask process. For example, an oxide semiconductor may be deposited entirely on the buffer layer 161 and then patterned via a photolithography process, to form the semiconductor layer ACT as shown in FIG. 5.

Subsequently, a first insulating layer 162 is deposited entirely on the buffer layer 161 on which the semiconductor layer ACT is formed, and a patterned first conductive layer 120 is formed on the first insulating layer 162. The patterned first conductive layer 120 may be formed via a mask process. For example, a material layer for the first conductive layer may be formed on the first insulating layer 162, a photoresist layer may be applied onto the material layer for the first conductive layer, a photoresist pattern may be formed via exposure and development processes, and the material layer for the first conductive layer may be etched using it as an etching mask, so that the patterned first conductive layer 120 including a gate electrode GE may be formed as shown in FIG. 5. Subsequently, the photoresist pattern is removed via a stripping process or an ashing process.

Subsequently, a second insulating layer 162 is stacked on the first insulating layer 162 on which the first conductive layer 120 is formed, and a first contact hole CNT1 for exposing a part of the semiconductor layer ACT (source region and drain region) is formed. The process of forming the first contact hole CNT1 may be carried out via a mask process. For example, a material layer for the second insulating layer is deposited entirely on the first insulating layer 162 on which the first conductive layer 120 is formed, a photoresist layer is applied on the material layer for the second insulating layer, a photoresist pattern exposing parts of the semiconductor layer ACT (source region and drain region) is formed through exposure and development, and then a first contact hole CNT1 is formed using this as an etching mask, which penetrates through the first insulating layer 162 and the second insulating layer 163 to expose a part of the semiconductor layer ACT. Subsequently, the photoresist pattern is removed via a stripping process or an ashing process.

Subsequently, a patterned second conductive layer 130 is formed on the second insulating layer 163. The patterned second conductive layer 130 may be formed via a mask process. For example, a material layer for the second conductive layer is deposited entirely on the second insulating layer 163. During the deposition process, the material layer for the second conductive layer may be deposited even to the inside of the first contact hole CNT1, to be connected to some regions of the semiconductor layer ACT thereunder. Subsequently, a photoresist layer is applied onto the material layer for the second conductive layer, a photoresist pattern is formed by exposure and development. Then, the material layer for the second conductive layer is etched by using it as an etch mask. Subsequently, the photoresist pattern is removed via a strip or ashing process, to form the patterned second conductive layer 130 as shown in FIG. 5.

Figure 6:
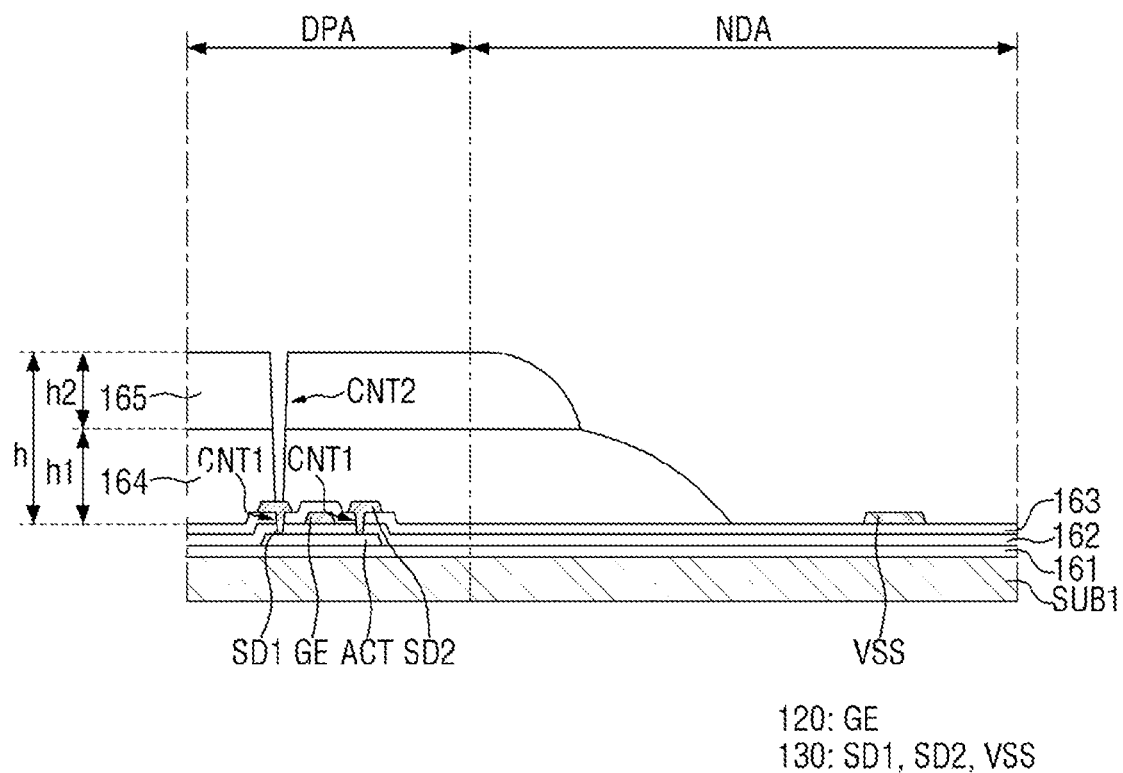

Subsequently, referring to FIG. 6, patterned via layers 164 and 165 are formed on the second insulating layer 163 on which the patterned second conductive layer 130 is formed. The patterned via layers 164 and 165 may include a first via layer 164 and a second via layer 165. The patterned via layers 164 and 165 may be formed by forming the first via layer 164 and then the second via layer 165, and by forming a second contact hole CNT2 penetrating through the first via layer 164 and the second via layer 165.

Subsequently, the patterned first via layer 164 is formed on the second insulating layer 163 on which the second conductive layer 130 is formed. The patterned first via layer 164 may be formed so that it has a substantially flat surface in the display area DPA and exposes the second supply voltage line VSS in the non-display area NDA. The pattern first via layer 164 may be made of, for example, an organic material including a photosensitive material. In such case, the patterned first via layer 164 for exposing the second supply voltage line VSS disposed in the non-display area NDA may be formed by applying an organic material layer for the first via layer and then performing the exposure and development. The thickness h1 of the first via layer 164 in the display area DPA may range from, but is not limited to, about 2 μm to about 5 μm.

Subsequently, the patterned second via layer 165 is formed on the patterned first via layer 164. The patterned second via layer 165 may be formed to cover the upper surface of the first via layer 164 in the display area DPA and expose a part of the side surface of the first via layer 164 in the non-display area NDA. The patterned second via layer 165 may be made of, for example, an organic material including a photosensitive material. In such case, the patterned second via layer 165 for exposing the side surface of the first via layer 164 located in the non-display area NDA may be formed by applying an organic material layer for the second via layer and then performing the exposure and development. The thickness h2 of the second via layer 165 may be, but is not limited to being, equal to or less than the thickness h1 of the first via layer 164. The thickness h2 of the second via layer 165 in the display area DPA may range from about 2 μm to about 5 μm. Although the thickness h2 of the second via layer 165 is smaller than the thickness h1 of the first via layer 164 in the example shown in FIG. 4, the present disclosure is not limited thereto. The thickness h2 of the second via layer 165 may be equal to the thickness h1 of the first via layer 164.

The via layers 164 and 165 may include a second contact hole CNT2 exposing the first electrode SD1 of the transistor TR. The second contact hole CNT2 may be configured as the contact hole of the second via layer 165 overlapping with the contact hole of the first via layer 164 together with the contact hole of the first via layer 164 exposing the first electrode SD1 of the transistor TR. The process of forming the second contact hole CNT2 may be carried out via the same mask process as the process of forming the patterned second via layer 165.

According to this embodiment, the thickness h of the via layers 164 and 165 may be equal to the sum of the thickness h1 of the first via layer 164 and the thickness h2 of the second via layer 165. The thickness h of the via layers 164 and 165 in the display area DPA may range from, but is not limited to, about 4 μm to about 10 μm. The via layers 164 and 165 may have the thickness h ranging from about 4 μm to about 10 μm in the display area DPA, and may expose the second supply voltage line VSS and a part of the second insulating layer 163 in the non-display area NDA.

As the via layers 164 and 165 have different thicknesses in the display area DPA and the non-display area NDA, there may be a level difference (or a height difference between the surfaces) between the upper surface of the top layer of the plurality of layers disposed in the display area DPA and the upper surface of the top layer of the plurality of layers disposed in the non-display area NDA. For example, there may be a level difference between the upper surface of the second via layer 165 that is the top layer of the plurality of layers disposed in the display area DPA and the upper surface of the second insulating layer 163 that is the top layer of the plurality of layers disposed in the non-display area NDA. As used herein, the phrase "there is a level difference between areas" refers that there is a height difference between the areas based on the heights measured from the same flat reference surface with no structure thereunder (e.g., the upper surface of the buffer layer 161).

As the thickness h of the via layers 164 and 165 disposed in the display area DPA is large, there may be a large level difference between the upper surface of the top layer of the plurality of layers disposed in the display area DPA and the upper surface of the top layer of the plurality of layers disposed in the non-display area NDA.

Figure 7:
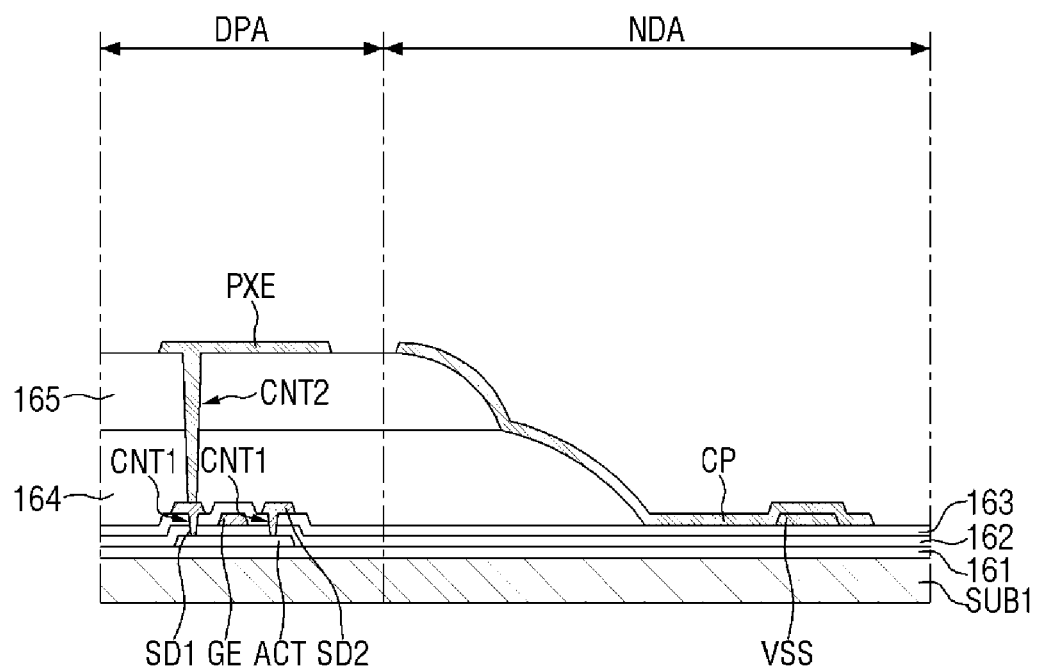

Subsequently, referring to FIG. 7, a patterned third conductive layer 140 is formed on the second via layer 165. The patterned third conductive layer 140 may be formed via a mask process. Specifically, a material layer for the third conductive layer is deposited entirely on the second via layer 165 disposed in the display area DPA, the second insulating layer 163 and the second supply voltage line VSS exposed by the second via layer 165 in the non-display area NDA. During the deposition process, the material layer for the third conductive layer may be deposited even to the inside of the second contact hole CNT2, to be connected to the first electrode SD1 of the transistor TR.

Subsequently, a photoresist layer is applied on the material layer for the third conductive layer, and a photoresist pattern is formed by exposure and development, which has a pattern shape of the pixel electrode PXE and the conductive pattern CP to remain. Subsequently, the material layer for the third conductive layer is etched using the photoresist pattern as an etch mask. The etching of the material layer for the third conductive layer may be performed by, but is not limited to, wet etching. Subsequently, the photoresist pattern is removed via an ashing process or a strip process.

Subsequently, referring to FIGS. 8 and 9, a pixel-defining layer PDL is formed on the patterned third conductive layer 140. The pixel-defining layer PDL may be made of, for example, an organic material including a photosensitive material. In such case, the patterned pixel-defining layer PDL may be formed by applying a material layer PDLa for the pixel-defining layer and then performing the exposure and development. The forming the pixel-defining layer PDL on the patterned third conductive layer 140 may include applying the material layer PDLa for the pixel-defining layer on the patterned third conductive layer 140, and forming the patterned pixel-defining layer PDL by the exposure and development using a light mask LM.

Figure 8:
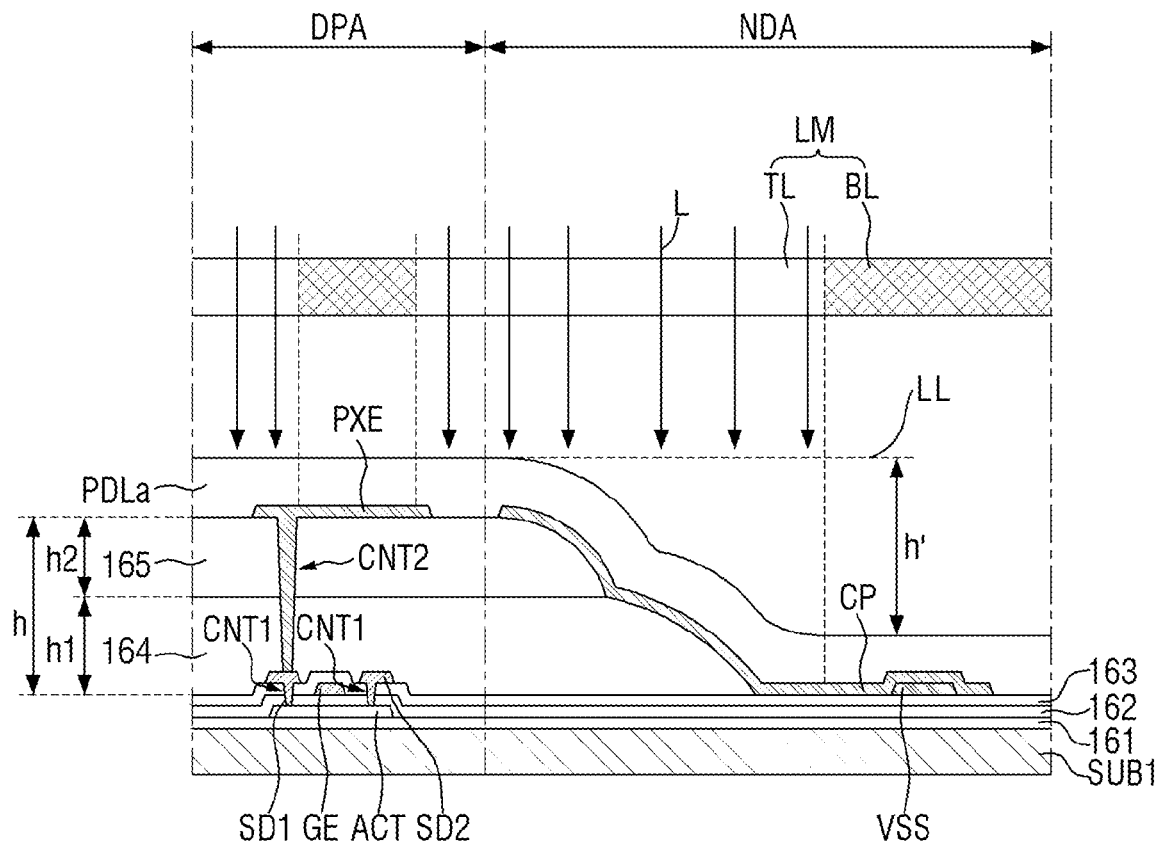

Specifically, referring to FIG. 8, the material layer PDLa for the pixel-defining layer may be applied entirely on the patterned third conductive layer 140. The material layer PDLa for the pixel-defining layer may be disposed on the pixel electrode PXE and the upper surface of the second via layer 165 on which the pixel electrode PXE is disposed in the display area DPA, and may be disposed on the conductive pattern CP, the side surfaces of the first and second via layers 164 and 165 on which the conductive pattern CP is disposed and the second insulating layer 163 on which the conductive pattern CP is disposed. That is to say, the material layer PDLa for the pixel-defining layer may be formed on the entire surface of the first substrate SUB1 so that it covers the third conductive layer 140 and the second via layer 165 and the second insulating layer 163 exposed by the third conductive layer 140.

The material layer PDLa for the pixel-defining layer applied entirely over the first substrate SUB1 may have different heights between different areas and thus may have level differences. Such level differences of the material layer PDLa for the pixel-defining layer may be created as the via layers 164 and 165 have a flat surface with no level difference in the display area DPA, while they have the inclined side surfaces with reducing thickness toward the outer side in the display area DPA and at a part of the non-display area NDA and they are not disposed at the other part of the non-display area NDA. That is, by the predetermined thickness h of the via layers 164 and 165, there may be a level difference (or height difference) h' between the surface of the material layer PDLa disposed in the display area DPA (or the surface of the material layer PDLa at a higher position) and the surface of the material layer PDLa disposed in the non-display area NDA such that it does not overlap with the via layers 164 and 165 (or the surface of the material layer PDLa disposed at a lower position). The level difference (or height difference) h' between the surface of the material layer PDLa disposed at a high position in the display area DPA and the surface of the material layer PDLa disposed at a lower position in the non-display area NDA may be substantially equal to the predetermined thickness h of the via layers 164 and 165.

Subsequently, the patterned pixel-defining layer PDL may be formed by exposing the material layer PDLa to light and developing it using the light mask LM.

Initially, the light mask LM may be prepared.

The light mask LM may include a plurality of regions TL and BL having different light transmittances. The light mask LM may include light-transmitting parts TL and light-blocking parts BL according to the transmittance (or transparency) of light. The transmittance of the light-blocking parts BL may be smaller than the transmittance of the light-transmitting parts TL. For example, the light-blocking parts BL may block substantially all of the lights L provided from the outside (transmittance is approximately 0%). The light-transmitting parts TL may transmit substantially all of the lights L provided from the outside (transmittance is approximately 100%). It is, however, to be understood that the present disclosure is not limited thereto. The light-blocking parts BL may transmit some of the lights L, with a light transmittance significantly smaller than that of the light-transmitting parts TL.

Subsequently, the light mask LM may be placed above the material layer PDLa for the pixel-defining layer, and an exposure process may be performed.

The light mask LM may be placed such that the light-blocking parts BL are in line with a region in which an opening OP1 is to be formed and a part of the conductive pattern CP covering the second supply voltage line VSS, and the light-transmitting parts TL are in line with regions in which the opening OP1 is not formed and another part of the conductive pattern CP covering the second supply voltage line VSS. In other words, the regions where the material layer PDLa needs to remain may be aligned with to the light-transmitting parts TL, while the regions where the material layer PDLa needs to be removed may be aligned with the light-blocking parts BL.

The light-blocking parts BL can block the lights L provided from the outside, so that the lights L cannot reach the material layer PDLa for the pixel-defining layer overlapping with the region where the opening OP1 is to be formed in the display area DPA and the region where the conductive pattern CP is to be exposed in the non-display area NDA. The light-transmitting parts TL can transmit most of the lights L provided from the outside, so that most of the lights L can reach the regions in which the opening OP1 is not to be formed in the display area DPA and the material layer PDLa overlapping with the upper and side surfaces of the first and second via layers 164 and 165 in the non-display area NDA.

According to an embodiment of the present disclosure, the material layer PDLa for the pixel-defining layer may include a negative sensitizer. When the material layer PDLa contains a negative photosensitive material, the regions of the material layer PDLa exposed to light may be cured and thus may not be easily dissolved by a developing solution, whereas the regions not exposed to light may retain the properties and may be dissolved easily by the developing solution. As the chemical characteristics of the material layer PDLa change differently depending on whether it is exposed to light L or not, it is possible to selectively remove some regions of it while leaving other regions by using a developing solution.

Accordingly, after the exposure process has been carried out, some regions of the material layer PDLa in line with the light-blocking parts BL not exposed to light may retain the characteristics and thus may be easily dissolved by a developing solution, whereas some other regions of the material layer PDLa in line with the light-transmitting parts TL exposed to light may not be easily dissolved. Accordingly, some regions of the material layer PDLa in line with the light-blocking parts BL can be dissolved by a developing solution and removed, whereas some other regions of the material layer PDLa in line with the light-blocking parts BL can remain without being dissolved by the developing solution.

According to an embodiment of the present disclosure, the focus of the light L may be adjusted with respect to the surface LL of the material layer PDLa disposed in the display area DPA (the surface of the material layer PDLa disposed at a higher position) which is exposed to light during the exposure process. When the light L is adjusted so that it is focused on the surface LL of the material layer PDLa for the pixel-defining layer disposed in the display area DPA, a defocusing effect can be induced, i.e., the exposed surface of the material layer PDLa disposed at a lower position may be out of the focus of the light due to the level difference h' between the material layer PDLa disposed at the high position and the material layer PDLa disposed at the lower position. When the light is defocused so that the focus is distant from the exposed surface, the boundary of the regions exposed to light through the transmitting parts PL may become vague. When this happens, the side surface at the boundary may be formed with a gentle slope via the exposure process.

Figure 9:
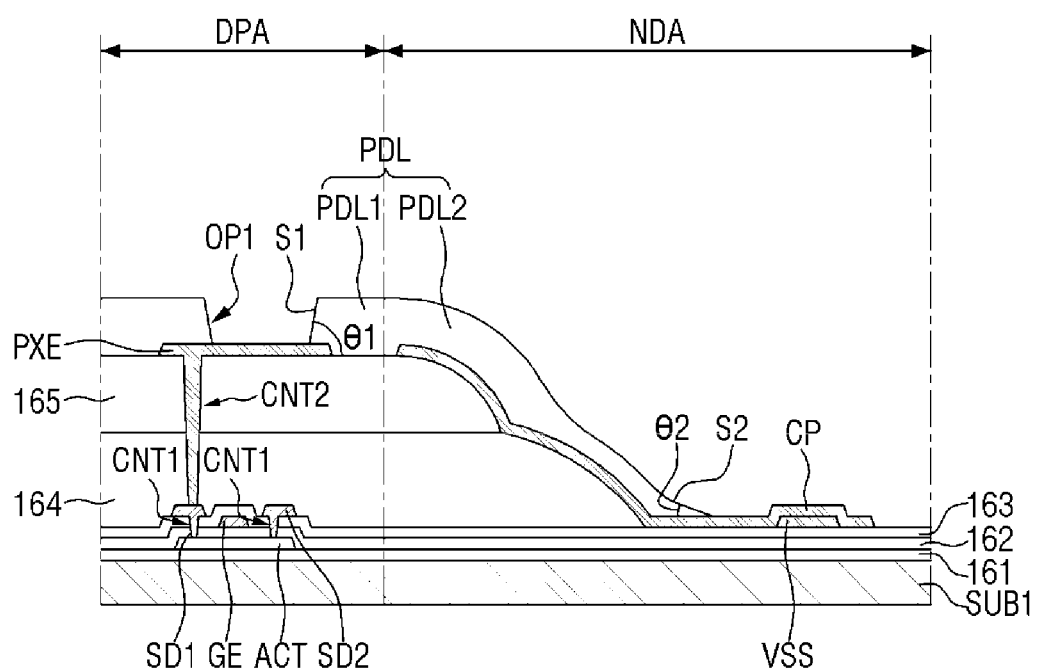

Accordingly, when the focus of the light is adjusted with respect to the surface LL of the material layer PDLa disposed at the higher position during the exposure process, the material layer PDLa disposed at the higher position is exactly focused, so that the first side surface S1 of the first area PDL1 of the pixel-defining layer PDL may be formed in a tapered shape with a sharp slope (the first taper angle θ1), as shown in FIG. 9. In addition, when the focus of the light is adjusted with respect to the surface LL of the material layer PDLa disposed at the higher position, the focus of the light is defocused from the material layer PDLa disposed at the lower position by a value equal to the level difference h' between the material layer PDLa disposed at the higher position and the material layer PDLa disposed at the lower position, so that the second side surface S2 of the second area PDL2 of the pixel-defining layer PDL may be formed in a tapered shape with a gentle slope (the second taper angle θ2), as shown in FIG. 9. Although not limited thereto, the first taper angle θ1 formed by the first side surface S1 of the first area PDL1 of the pixel-defining layer PDL may range from about 55° to about 85°, and preferably from about 70° to about 80°. The second taper angle θ2 formed by the second side surface S2 of the second area PDL2 of the pixel-defining layer PDL may range from about 20° to about 50°.

That is, according to the exposure process, it is possible to form the pixel-defining layer PDL having different taper angles at different areas via a single exposure process without any additional process by way of inducing the defocusing effect by utilizing the level difference h' of the material layer PDLa between different areas created by the via layers 164 and 165.

In addition, the material layer PDLa for the pixel-defining layer may include a liquid-repellent material. When the material layer PDLa including the liquid-repellent material is exposed to light L, the distribution of the liquid-repellent material in the material layer PDLa may increase at the surface of the material layer PDLa exposed to light L. Accordingly, the liquid repellency of the surface of the pixel-defining layer PDL may be increased via the exposure process. Therefore, it is possible to reduce the amount of the liquid-repellent material included in the material layer PDLa for the pixel-defining layer, thereby saving process cost. In addition, the surface of the pixel-defining layer PDL can be more smoothly coated with the liquid-repellent material, and thus the ink can be easily located at a desired place during the inkjet printing process for forming the emissive layer EML.

Subsequently, referring to FIGS. 10 and 11, an emissive layer EML may be formed via an inkjet printing process.

Figure 10:
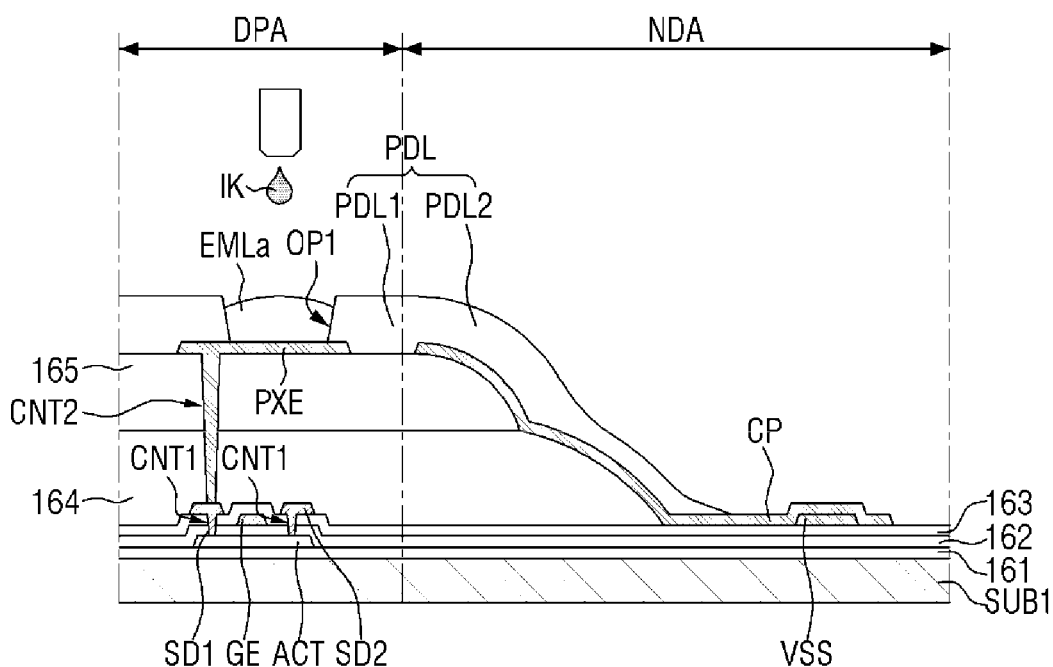

Specifically, referring to FIG. 10, a material layer EMLa for the emissive layer is formed on the pixel electrode PXE exposed by the first area PDL1 of the pixel-defining layer PDL. Although not limited thereto, the material layer EMLa may be formed by ejecting an ink IK onto a region partitioned by the opening OP1 defined in the first area PDL1 of the pixel-defining layer PDL by using an inkjet printing device (or a droplet ejection device). The ink IK may include the same material as the material included in the material layer EMLa. The material layer EMLa may be formed on the pixel electrode PXE exposed by the first area PDL1 of the pixel-defining layer PDL.

As described above, the pixel-defining layer PDL may include a liquid-repellent material. As the pixel-defining layer PDL includes the liquid-repellent material, it includes the same material as the material layer EMLa for the emissive layer, and thus the surface adhesive force between the ink IK ejected onto the opening OP1 partitioned by the first area PDL1 of the pixel-defining layer PDL and the pixel-defining layer PDL is low. Accordingly, the contact angle between the ink IK and the pixel-defining layer PDL can be increased. Accordingly, the ink IK does not overflow onto the upper surface of the pixel-defining layer PDL, and can be stably positioned within the area partitioned by the opening OP1 defined in the pixel-defining layer PDL.

Figure 11:
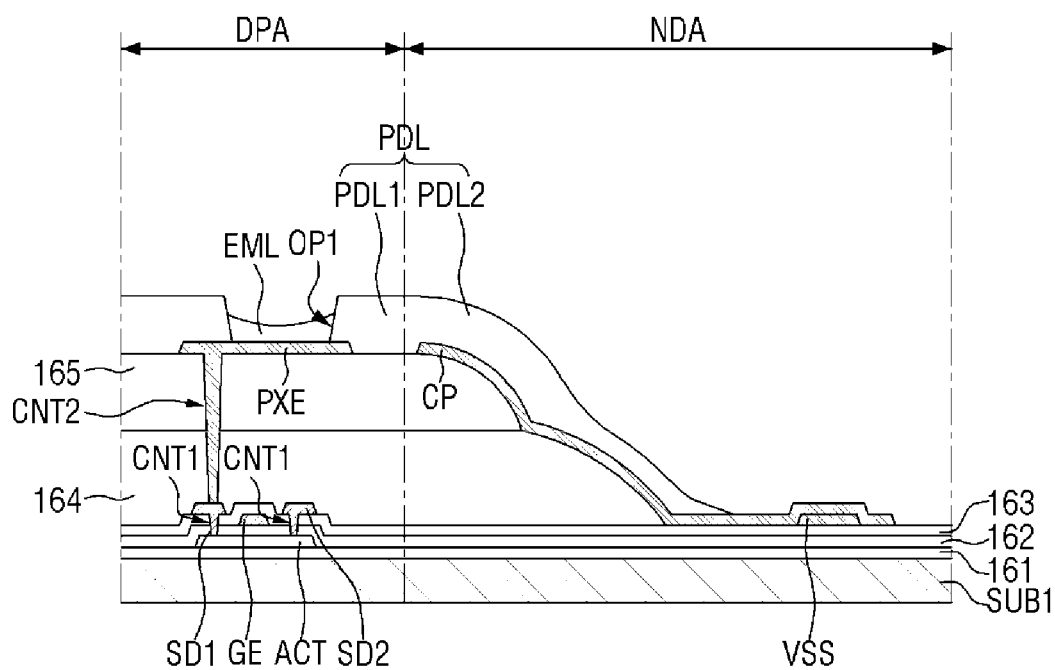

Subsequently, the material layer EMLa for the emissive layer is formed in the opening OP1 by using an inkjet printing process, and then the material layer EMLa is dried to form the emissive layer EML as shown in FIG. 11. By the drying process, the solvent of the material layer EMLa for the emissive layer may be evaporated, and the volume may be reduced, to form the emissive layer EML as shown in FIG. 11. The amount of the ink IK per single ejection (or discharge) may be determined in consideration of the surface tension of the ink IK and the amount of the reduced volume after drying. Incidentally, by forming a large first taper angle θ1 of the side surface of the first area PDL1 of the pixel-defining layer PDL as described above, even if there are deviations in the amount of the ejected ink IK, it is possible to reduce deviations in the thickness of the emissive layers EML according to the amount of ejected ink IK.

Subsequently, referring to FIG. 4, a common electrode CME may be formed on the pixel-defining layer PDL. The common electrode CME may be formed entirely to completely cover the pixel-defining layer PDL, the emissive layer EML and the conductive pattern CP exposed by the pixel-defining layer PDL. When the common electrode CME is formed on the pixel-defining layer PDL, it is possible to prevent the common electrode CME from being disconnected at the end of the second area PDL2 of the pixel-defining layer PDL by making the second taper angle θ2 of the second side S2 of the second area PDL2 of the pixel-defining layer PDL small, as described above.

According to the method of fabricating the display device according to this embodiment, there may be level differences (or height differences) h' of the surface of the material layer PDLa between different areas due to the predetermined thickness h of the via layers 164 and 165. Accordingly, when the light L is adjusted so that it is focused on the surface LL of the material layer PDLa for the pixel-defining layer disposed at a higher position during the exposure process of forming the pixel-defining layer PDL by illuminating the light L onto the material layer PDLa, a defocusing effect can be induced on the material layer PDLa disposed at a lower position, i.e., the exposed surface of the material layer PDLa disposed at the lower position may be out of the focus of the light. Accordingly, it is possible to form the pixel-defining layer PDL having different taper angles at different areas via a single exposure process without any additional process by way of inducing the defocusing effect by utilizing the level difference h' of the material layer PDLa between different areas created by the via layers 164 and 165.

Figure 12:
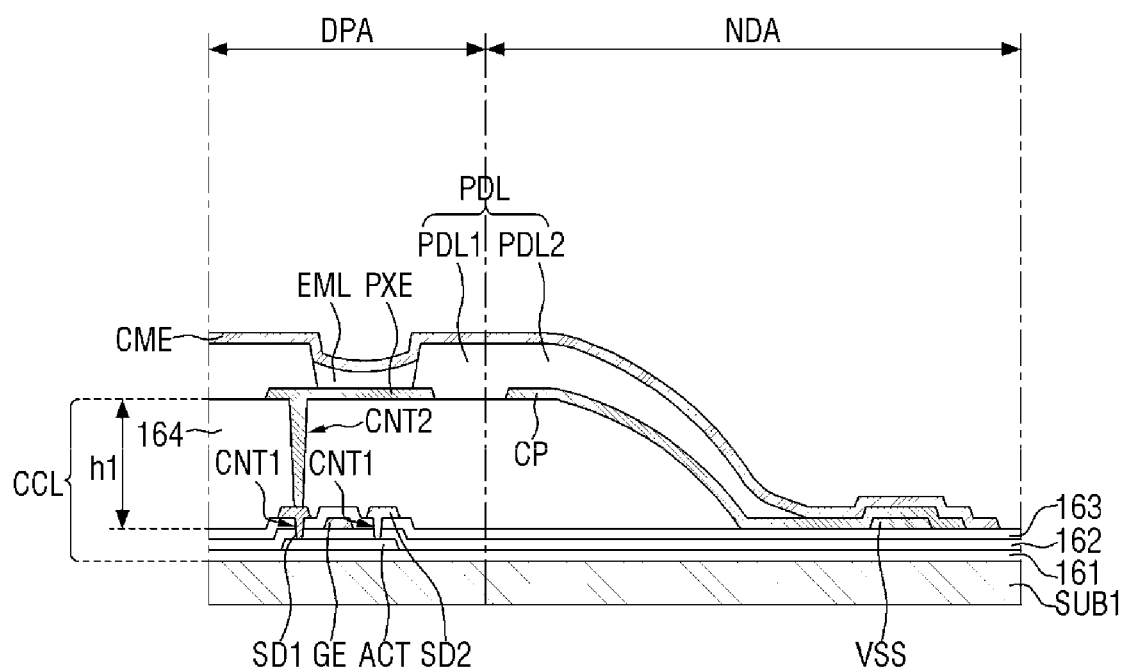
FIG. 12 is a cross-sectional view of a first display substrate of a display device according to another embodiment.

FIG. 12 is a cross-sectional view of a first display substrate of a display device according to another embodiment.

The first display substrate of the display device according to the embodiment of FIG. 12 is different from that of the embodiment of FIG. 4 in that the second via layer 165 is eliminated.

Specifically, the first display substrate may not include the second via layer 165. In this instance, a third conductive layer 140 may be disposed on a first via layer 164, and a pixel-defining layer PDL may be in direct contact with a part of the upper surface of the first via layer 164 on which the third conductive layer 140 is not disposed. The thickness h1 of the first via layer 164 may range from, but is not limited to, about 2 µm to about 10 µm.

Even though the second via layer 165 is eliminated from the display device according to this embodiment of the present disclosure, the first via layer 164 may be formed thick to have a predetermined thickness h1. Therefore, by using the level differences of the material layer PDLa (see FIG. 8) formed by the thickness h1 of the first via layer 164, it is possible to make the first taper angle θ1 of the first side surface S1 of the first area PDL1 of the pixel-defining layer PDL defining the opening OP1 different from the second taper angle θ2 of the second side surface S2 at the end of the second area PDL2 of the pixel-defining layer PDL, as described above. As a result, the process of forming the second via layer 165 is omitted, so that the efficiency of the process of fabricating the display device 1 can be improved.

Figure 13:
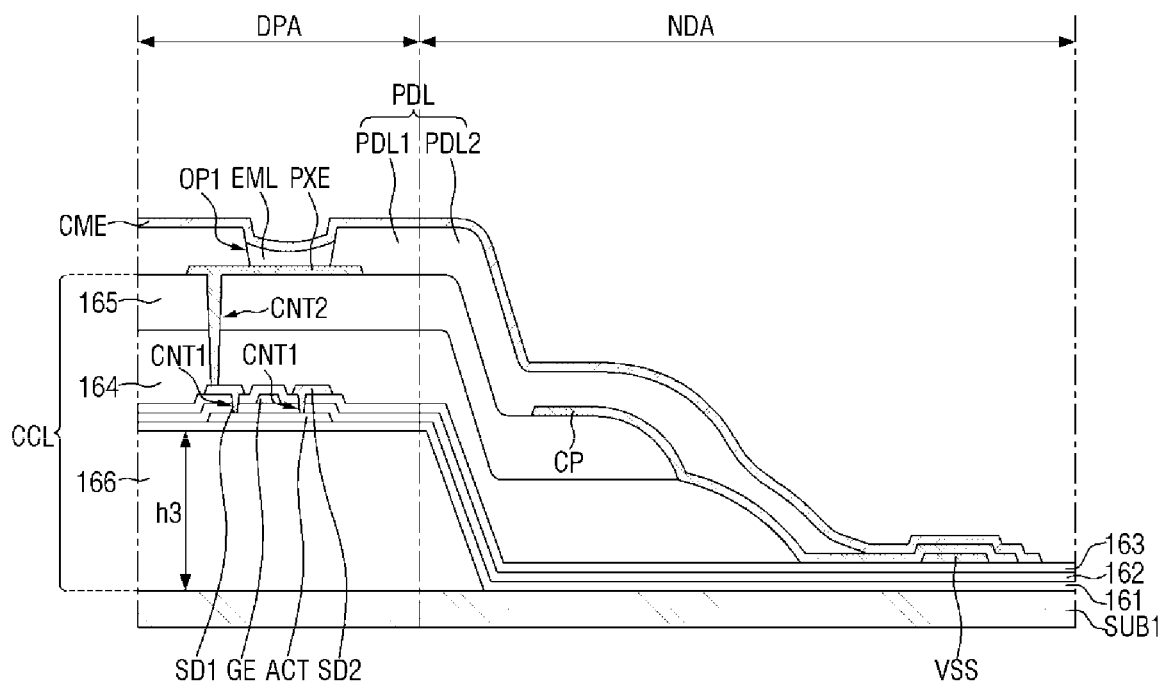
FIG. 13 is a cross-sectional view of a first display substrate of a display device according to yet another embodiment.

FIG. 13 is a cross-sectional view of a first display substrate of a display device according to yet another embodiment.

The first display substrate of the display device according to the embodiment of FIG. 13 may further include a step auxiliary layer 166.

The step auxiliary layer 166 may be disposed between a buffer layer 161 and a first substrate SUB1 in the display area DPA. A part of the step auxiliary layer 166 may be disposed in the non-display area NDA as well. The step auxiliary layer 166 may include a polymer such as polyimide (PI) and acryl. The step auxiliary layer 166 may have a predetermined thickness h3. The thickness h3 of the step auxiliary layer 166 may have, but is not limited to, a range of about 5 µm to about 13 µm. The step auxiliary layer 166 is formed to have the predetermined thickness h3, and as described above, in order to induce the defocusing effect in the process of forming the pixel-defining layer PDL, the step auxiliary layer 166 can increase the level difference between the display area DPA and the non-display area NDA.

The display device according to this embodiment further includes the step auxiliary layer 166 having the thickness h3 between the first substrate SUB1 and the buffer layer 161 in the display area DPA, thereby increasing the level differences of the material layer PDLa between different areas. Accordingly, the level differences of the material layer PDLa can be increased between the different areas, so that the taper angle of the pixel-defining layer PDL can be easily adjusted in each of the different areas.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A display device comprising:
a substrate including a display area and a non-display area;
a via layer disposed on the substrate;
a pixel electrode disposed on the via layer in the display area;
a pixel-defining layer disposed on the pixel electrode and a part of the via layer exposed by the pixel electrode;
a conductive pattern disposed in the non-display area; and
a common electrode disposed on the pixel-defining layer and directly contacting the conductive pattern in the non-display area,
wherein the pixel-defining layer includes a first area disposed in the display area and a second area having an end disposed in the non-display area, and an opening extending to a part of the pixel electrode is defined in the pixel-defining layer,
wherein the first area includes a first side surface defining the opening,
wherein the second area includes a second side surface at the end,
wherein a first taper angle which is a taper angle of the first side surface is different from a second taper angle which is a taper angle of the second side surface,
wherein the conductive pattern is interposed between the via layer and the second area of the pixel-defining layer, and
wherein any portion of the conductive pattern which overlaps the via layer does not directly contact the common electrode in the non-display area.

2. The display device of claim 1, wherein each of the first and second side surfaces has a tapered shape.

3. The display device of claim 2, wherein the first taper angle is greater than the second taper angle.

4. The display device of claim 3, wherein the first taper angle is in a range of about 55° to about 85°, and the second taper angle is an acute angle with a range equal to or less than about 50°.

5. The display device of claim 1, wherein the second area is disposed to cover a side surface of the via layer.

6. The display device of claim 5, wherein the end of the second area is located outside of the side surface of the via layer.

7. The display device of claim 1, further comprising:
an emissive layer disposed on the part of the pixel electrode defined by the opening,
wherein the common electrode covers the emissive layer and the pixel-defining layer.

8. The display device of claim 1, further comprising:
a step auxiliary layer disposed on the substrate in the display area; and
a buffer layer disposed on the step auxiliary layer,
wherein the via layer is disposed on the buffer layer.

9. The display device of claim 1, wherein the via layer has a thickness in a range of about 2 µm to about 10 µm.

10. The display device of claim 9, wherein the via layer includes a first via layer disposed on the substrate and having a first thickness, and a second via layer disposed on the first via layer and having a second thickness, and
wherein the first thickness is equal to or greater than the second thickness.

11. The display device of claim 10, wherein the first thickness is in a range of about 2 µm to about 5 µm, and the second thickness is in a range of about 2 µm to about 5 µm.

12. The display device of claim 1, wherein the pixel-defining layer is liquid-repellant and has a contact angle with water greater than 90° and less than 180°.

13. The display device of claim 12, wherein the pixel-defining layer includes a negative sensitizer.

14. A display device comprising:
a substrate including a display area and a non-display area;
a semiconductor layer disposed on the substrate;
a first insulating layer disposed on the semiconductor layer;
a first conductive layer disposed on the first insulating layer and including a gate electrode;
a second insulating layer disposed on the first conductive layer;
a second conductive layer disposed on the second insulating layer and including a supply voltage line;

a via layer disposed on the second conductive layer and not covering the supply voltage line;

a pixel electrode disposed on the via layer;

a pixel-defining layer disposed on the pixel electrode and a part of the via layer exposed by the pixel electrode;

a conductive pattern disposed in the non-display area; and a common electrode on the pixel-defining layer and directly contacting the conductive pattern in the non-display area, wherein the pixel-defining layer includes an end disposed between the via layer and the supply voltage line, and an opening exposing a part of the pixel electrode is defined in the pixel-defining layer, wherein the pixel-defining layer includes a first side surface defining the opening and a second side surface at the end, wherein a first taper angle which is a taper angle of the first side surface of the pixel-defining layer is different from a second taper angle which is a taper angle of the second side surface of the pixel-defining layer, wherein the conductive pattern is interposed between the via layer and the second side surface of the pixel-defining layer, and wherein any portion of the conductive pattern which overlaps the via layer does not directly contact the common electrode in the non-display area.

15. The display device of claim 14, wherein each of the first side surface and the second side surface of the pixel-defining layer has a tapered shape.

16. The display device of claim 15, wherein the first taper angle is greater than the second taper angle.

17. The display device of claim 16, wherein the first taper angle is in a range of about 55° to about 85°, and the second taper angle is an acute angle with a range equal to or less than about 50°.

18. The display device of claim 14, wherein the pixel-defining layer is disposed to cover an upper surface and a side surface of the via layer exposed by the pixel electrode.

* * * * *